(12) United States Patent
Kikuchi

(10) Patent No.: US 7,511,999 B1
(45) Date of Patent: Mar. 31, 2009

(54) MIS-TRANSISTOR-BASED NONVOLATILE MEMORY WITH RELIABLE DATA RETENTION CAPABILITY

(75) Inventor: Takashi Kikuchi, Fukuoka (JP)

(73) Assignee: NSCore Inc., Fukuoka (JP)

( * ) Notice: Subject to any disclaimer, the term of this patent is extended or adjusted under 35 U.S.C. 154(b) by 22 days.

(21) Appl. No.: 11/935,458

(22) Filed: Nov. 6, 2007

(51) Int. Cl.
G11C 14/00 (2006.01)

(52) U.S. Cl. .............. 365/185.05; 365/189.08; 365/230.08

(58) Field of Classification Search ............ 365/185.05, 365/189.08, 230.08
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,956,269 A | 9/1999 | Ouyang et al. | |
| 6,038,168 A | 3/2000 | Allen et al. | |
| 6,064,590 A | 5/2000 | Han et al. | |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizin et al. | |
| 2004/0252554 A1 | 12/2004 | Fournel et al. | |
| 2005/0232009 A1* | 10/2005 | Nakamura | 365/185.08 |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | 2006/093629 | 9/2006 |

* cited by examiner

Primary Examiner—Huan Hoang
Assistant Examiner—Jason Lappas
(74) Attorney, Agent, or Firm—Ladas & Parry LLP

(57) ABSTRACT

A nonvolatile semiconductor memory device includes a nonvolatile memory cell including an odd number of MIS transistor pairs, each of which stores one-bit data by creating an irreversible change of transistor characteristics in one of the two paired MIS transistors, latches equal in number to the odd number of MIS transistor pairs to store the odd number of one-bit data recalled from the MIS transistor pairs, the recalling of the one-bit data of a given MIS transistor pair being performed by sensing a difference in the transistor characteristics between the two paired MIS transistors of the given MIS transistor pair, and a majority decision circuit configured to make a majority decision based on the odd number of one-bit data to determine a bit value of the nonvolatile memory cell.

8 Claims, 19 Drawing Sheets

| DOUT2 | DOUT1 | DOUT0 | DOUTR |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |
| x | x | x | 0 |

FIG.20

| C2 | C1 | C0 | SLT |
|----|----|----|-----|
| L  | L  | L  | L   |
| L  | L  | H  | L   |
| L  | H  | L  | L   |
| L  | H  | H  | H   |
| H  | L  | L  | L   |
| H  | L  | H  | H   |
| H  | H  | L  | H   |
| H  | H  | H  | H   |

MIS-TRANSISTOR-BASED NONVOLATILE MEMORY WITH RELIABLE DATA RETENTION CAPABILITY

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

PermSRAM is a new type of nonvolatile semiconductor memory device. PermSRAM uses a pair of MIS (metal-insulating film-semiconductor) transistors to store one-bit data in a nonvolatile manner. These MIS transistors used for nonvolatile data retention in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The pair of MIS transistors used for nonvolatile data retention in PermSRAM are configured to selectively experience an irreversible hot-carrier effect on purpose for storage of one-bit data. Here, the irreversible hot-carrier effect refers to the injection of electrons into an oxide film of a selected transistor, which creates a shift in the threshold voltage of this transistor A difference in the transistor characteristics (i.e., difference in the threshold voltage) between the two MIS transistors caused by the hot-carrier effect represents one-bit data "0" or "1". Such a difference may be detected as a difference in the ON current between the two MIS transistors by using a sensing circuit such as a one-bit static memory circuit (latch) coupled to the MIS transistor pair.

It is preferable to improve the reliability of PermSRAM such that no bit is erroneously reversed between the writing of data and the reading of data.

SUMMARY OF THE INVENTION

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

According to at least one embodiment of the present invention, a nonvolatile semiconductor memory device includes a nonvolatile memory cell including an odd number of MIS transistor pairs, each of which stores one-bit data by creating an irreversible change of transistor characteristics in one of the two paired MIS transistors, latches equal in number to the odd number of MIS transistor pairs to store the odd number of one-bit data recalled from the MIS transistor pairs, the recalling of the one-bit data of a given MIS transistor pair being performed by sensing a difference in the transistor characteristics between the two paired MIS transistors of the given MIS transistor pair, and a majority decision circuit configured to make a majority decision based on the odd number of one-bit data to determine a bit value of the nonvolatile memory cell.

BRIEF DESCRIPTION OF THE DRAWINGS

Other objects and further features of the present invention will be apparent from the following detailed description when read in conjunction with the accompanying drawings, in which:

FIG. 20 is a truth table showing the relationships between the signal levels of nodes C0 through C2 and the signal level of an SARM data line SLT.

DESCRIPTION OF THE PREFERRED EMBODIMENTS

In the following, embodiments of the present invention will be described with reference to the accompanying drawings.

The present invention is directed to PermSRAM, which stores one-bit data in a pair of MIS transistors that have the same structure as ordinary MIS transistors used for conventional transistor functions (e.g., switching function). These MIS transistors for nonvolatile data retention have neither a special structure such as a floating gate structure nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve nonvolatile data retention. Which one of the MIS transistors has a stronger lingering change determines whether the stored data is "0" or "1".

Further, a latch circuit is used to determine data to be stored in these memory MIS transistors. The latch circuit is also used to recall (sense) the data stored in the memory MIS transistors. Such latch circuit and a pair of memory MIS transistors together constitute a memory unit (memory circuit) for storing and recalling one-bit data.

Figure 1:
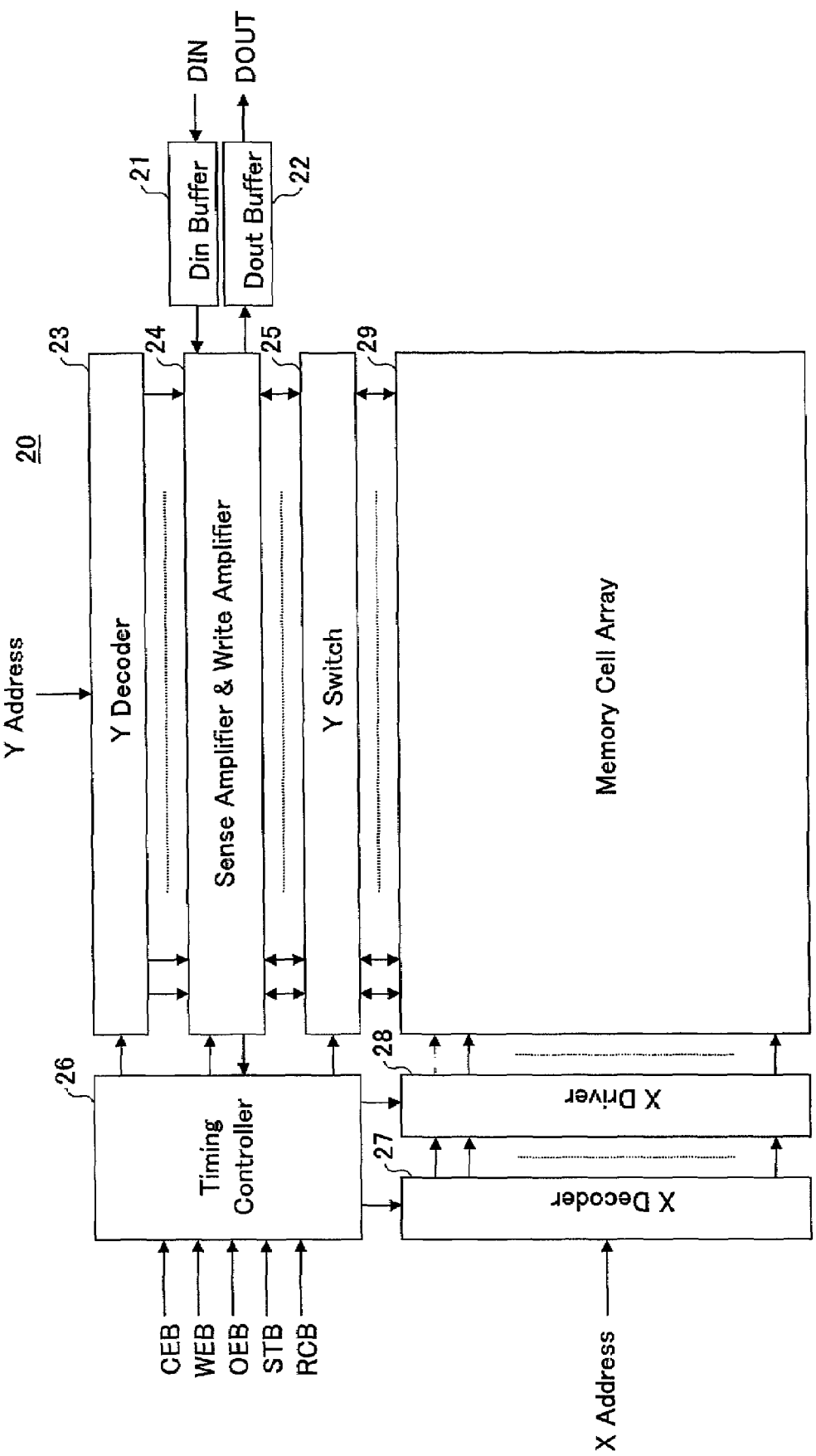
FIG. 1 is a block diagram showing a general configuration of a nonvolatile semiconductor memory device according to the present invention.

FIG. 1 is a block diagram showing a general configuration of a nonvolatile semiconductor memory device according to the present invention. A nonvolatile semiconductor memory device 20 shown in FIG. 1 includes a Din buffer 21, a Dout buffer 22, a Y decoder 23, a sense-amplifier-&-write-amplifier unit 24, a Y switch 25, a timing controller 26, an X decoder 27, an X driver 28, and a memory cell array 29.

The memory cell array 29 includes a plurality of memory cell units arranged in a matrix form, with a plurality of word lines extending in a first direction, and a plurality of bit lines extending in a second direction perpendicular to the first direction. Each memory cell unit has a circuit configuration as will later be described. The memory cell units arranged in the same column (same Y address) are connected to the same bit lines, and the memory cell units arranged in the same row (same X address) are connected to the same word line.

The timing controller 26 receives control signals from an external device, and decodes the control signals to determine an operation mode (e.g., a write operation mode or a read operation mode)

These control signals include a chip enable signal CEB, a write enable signal WEB, an output enable signal OEB, a store enable signal STB, and a recall enable signal RCB. Timing control signals responsive to the determined operation mode are supplied from the timing controller 26 to the Y decoder 23, the sense-amplifier-&-write-amplifier unit 24, the Y switch 25, the X decoder 27, the X driver 28, etc., for control of the individual parts of the semiconductor memory device 20.

The Y decoder 23 receives a Y address input from outside the nonvolatile semiconductor memory device 20, and decodes the Y address input to determine a selected column. The decode signals indicative of the selected column are supplied to the Y switch 25.

The X decoder 27 receives an X address input from outside the nonvolatile semiconductor memory device 20, and decodes the X address input to determine a selected row. The decode signals indicative of the selected row are supplied to the X driver 28.

In response to the timing control signals from the timing controller 26 and the decode signals from the X decoder 27, the X driver 28 activates a selected SRAM word line among the SRAM word lines extending from the X driver 28. As a result of the activation of the selected SRAM word line, SRAM cells (i.e., the latch circuits of memory cell units) are coupled to respective bit line pairs. Through this coupling, the writing/reading of data to/from the volatile memory cells is performed.

In response to the timing control signals from the timing controller 26 and the decode signals from the Y decoder 23, the Y switch 25 couples bit lines corresponding to the selected column to the sense-amplifier-&-write-amplifier unit 24. Through this coupling, data is transferred between the memory cell array 29 and the sense-amplifier-&-write-amplifier unit 24. In the write operation, input data DIN supplied to the Din buffer 21 from outside the nonvolatile semiconductor memory device 20 is provided to the sense-amplifier-&-write-amplifier unit 24. Write amplifiers of the sense-amplifier-&-write-amplifier unit 24 amplify the input data to be written to the memory cell array 29. The amplified input data is then supplied to the memory cell array 29 via the Y switch 25. In the read operation, sense amplifiers of the sense-amplifier-&-write-amplifier unit 24 amplify data read from the memory cell array 29 for provision to the Dout buffer 22. The data is output from the Dout buffer 22 to outside the device as output data DOUT.

Figure 2:
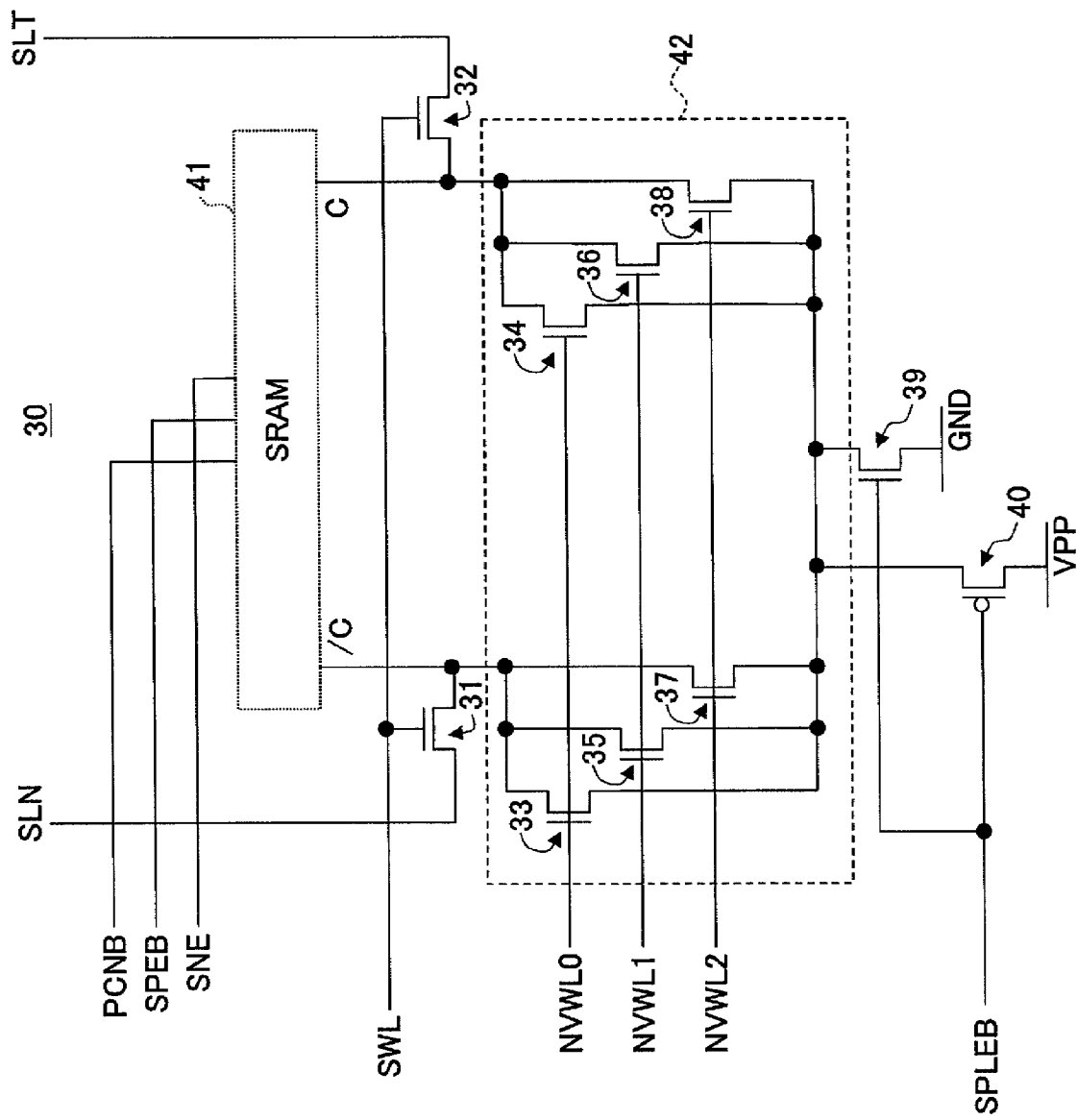
FIG. 2 is an illustrative drawing showing the configuration of a memory cell unit.

FIG. 2 is an illustrative drawing showing the configuration of a memory cell unit. A memory cell unit 30 in FIG. 2 includes NMOS transistors 31 through 39, a PMOS transistor 40, and an SRAM cell 41.

SRAM data lines (bit lines) SLN and SLT connect between the sense-amplifier-&-write-amplifier unit 24 (see FIG. 2) and the memory cell unit 30. Specifically, the SRAM data lines SLN and SLT are coupled to the SRAM cell 41 via the NMOS transistors 31, and 32, respectively. The SRAM cell 41 stores one-bit data supplied through the SRAM data lines SLN and SLT.

A pair of NMOS transistors 33 and 34, a pair of NMOS transistors 35 and 36, and a pair of NMOS transistors 37 and 38 together constitutes an NV cell 42, which serves as a nonvolatile memory cell for storing one-bit data. The NV cell 42 is connected to the SRAM cell 41. The SRAM cell 41 serves as a latch circuit for storing one-bit data to be stored in the NV cell 42, and also serves as a sense circuit to sense data stored in the NV cell 42.

Figure 3:
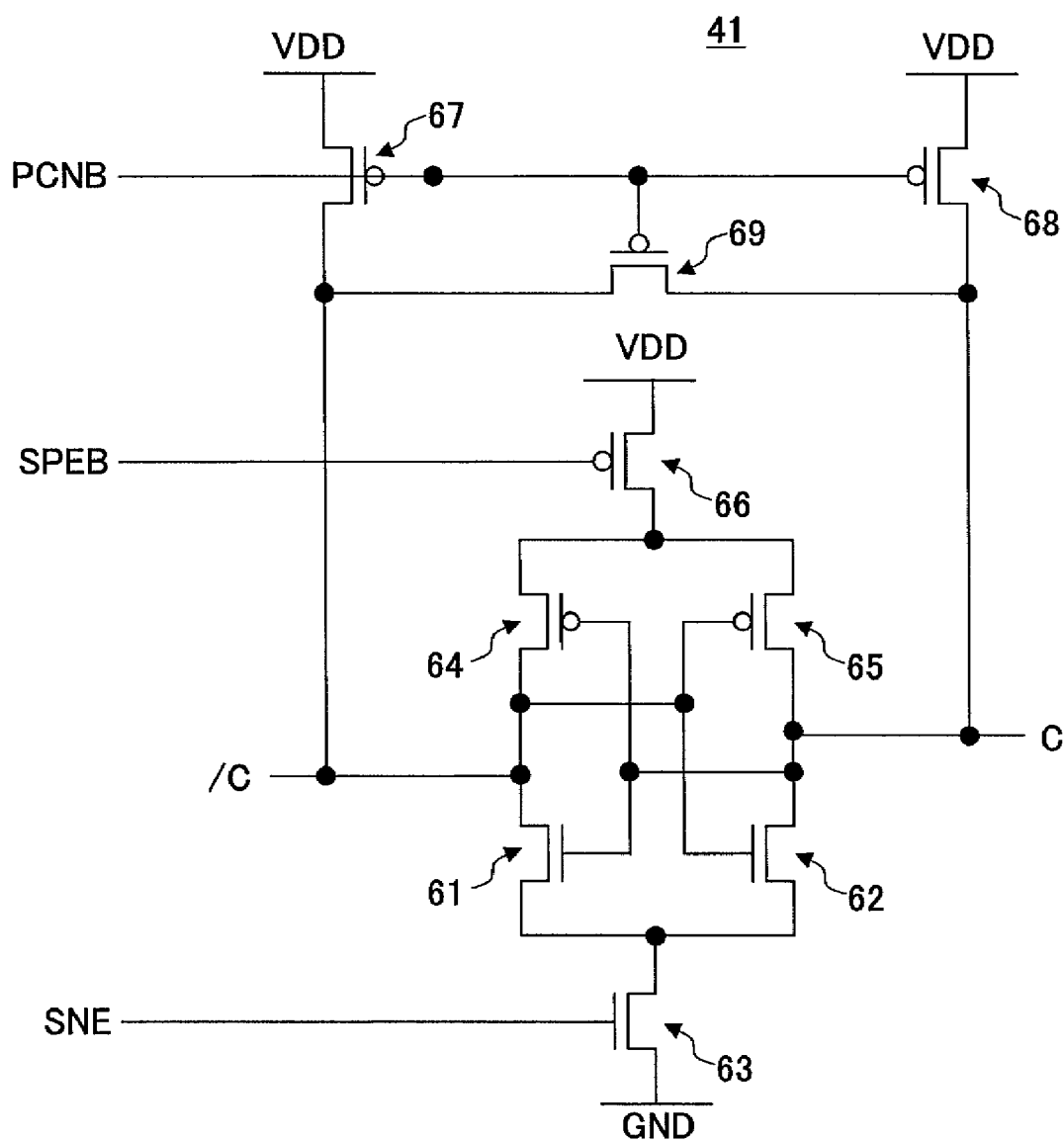
FIG. 3 is a drawing showing an example of the configuration of an SRAM cell.

FIG. 3 is a drawing showing an example of the configuration of the SRAM cell 41. The SRAM cell 41 shown in FIG. 3 includes NMOS transistors 61 through 63 and PMOS transistors 64 through 69. An inverter comprised of the NMOS transistor 61 and the PMOS transistor 64 is cross-coupled to an inverter comprised of the NMOS transistor 62 and the PMOS transistor 65, thereby forming a latch circuit for storing one-bit data supplied through the SRAM data lines SLN and SLT. This latch circuit also serves to amplify a voltage difference appearing between nodes C and /C in response to data stored in the NV cell 42.

Turning back to FIG. 2, the NMOS transistors 33 through 38 serving as nonvolatile memory cell transistors have the same structure as the other NMOS transistors such as the NMOS transistor 39 as well as the NMOS transistors used in the SRAM cell 41. Further, it is preferable to manufacture all the MOS transistors of the memory cell unit 30 with the same thickness of the gate oxide film. Namely, all the MOS transistors used in the memory cell unit 30 may be designed to operate with the same operating voltage (e.g., 1.8 V).

As shown in FIG. 2, the SRAM data lines SLN and SLT, which extend from the sense-amplifier-&-write-amplifier unit 24, are coupled to the SRAM cell 41 via the NMOS transistors 31 and 32. An SRAM word line SWL, which extends from the X driver 28, is connected to the gates of the NMOS transistors 31 and 32. NV word lines NVWL0 through NVWL2, which extend from the X driver 28, are coupled to the gate nodes of the NMOS transistors 33 through 38 as shown in FIG. 2.

Further, a cell precharge line PCNB, an SRAM PMOS enable line SPEB, and an SRAM NMOS enable line SNE, which extend from the X driver 28, are connected to the SRAM cell 41. Specifically, as shown in FIG. 3, the cell precharge line PCNB is coupled to the gates of the PMOS transistors 67 through 69 for the purpose of precharging and equalizing the node C and /C. The SRAM PMOS enable line SPEB and the SRAM NMOS enable line SNE are coupled to the gate of the PMOS transistor 66 and the gate of the NMOS transistor 63, respectively, so as to control the on/off state of the SRAM cell 41.

Turning back to FIG. 2, a store plate voltage enable line SPLEB which extends from the X driver 28 is coupled to the gate of the NMOS transistor 39 and to the gate of the PMOS transistor 40. In response to the LOW state of the store plate voltage enable line SPLEB, a high voltage VPP is applied to the NV cell 42, so that the data stored in the SRAM cell 41 is stored in the NV cell 42.

Such storing of data is done by creating a hot-carrier-effect-based change in transistor characteristics with respect to either one of paired NMOS transistors, whichever is selected by the data stored in the SRAM cell 41. For example, either one of the NMOS transistor 33 and the NMOS transistor 34 whose source node is set at the LOW level will experience a hot-carrier effect while the other one does not experience a hot-carrier effect. The NMOS transistor having experienced this hot-carrier effect ends up having a larger threshold voltage than the NMOS transistor having experienced no hot-carrier effect. The same applies to the second pair NMOS transistors 35 and 36 and the third pair NMOS transistors 37 and 38.

For the purpose of storing data, the NV word lines NVWL0 through NVWL2 are all set to a proper store potential (e.g., 1.65V), which is determined such as to maximize the effect of a hot-carrier phenomenon. Generally, such potential is selected to be half the voltage between the source node voltage and drain node voltage of the transistor that is subjected to a hot-carrier effect.

With the NV word lines NVWL0 through NVWL2 set to the store potential, the data latched in the SRAM cell 41 is stored in every single one of the three pairs of NMOS transistors included in the NV cell 42. Accordingly, all the three bits stored in the three pairs are supposed to be the same data. If some failure occurs during the data store operation, bit reversal may occur in some of these three bits. When the data is read, however, such bit reversal may be corrected through a majority rule, which will later be described in detail.

In response to the HIGH state of the store plate voltage enable line SPLEB, the data stored in the NV cell 42 is recalled, i.e., the data stored in the NV cell 42 is transferred to the SRAM cell 41. In this recall operation, the SRAM PMOS enable line SPEB and the SRAM NMOS enable line SNE are first set to HIGH and LOW, respectively, to make the PMOS transistor 66 and the NMOS transistor 63 (see FIG. 3) non-conductive, thereby placing the SRAM cell 41 in an inactive state. The cell precharge line PCNB is then set to LOW to precharge and equalize the node C and /C of the SRAM cell 41 (see FIG. 3). After this, the store plate voltage enable line SPLEB is set to HIGH to make the NMOS transistor 39 conductive, followed by setting the SRAM PMOS enable line SPEB and the SRAM NMOS enable line SNE to LOW and HIGH, respectively, to activate the SRAM cell 41. The SRAM cell 41 amplifies a voltage difference appearing between the node C and /C in response to a difference in the threshold voltages between the paired NMOS transistors.

In the data recall operation described above, only one of the NV word lines NVWL0 through NVWL2 is set to HIGH at a time, thereby recalling data from only a corresponding pair of NMOS transistors. The NV word line NVWL0 is set to HIGH when recalling data from the first pair of NMOS transistors 33 and 34. The NV word line NVWL1 is set to HIGH when recalling data from the second pair of NMOS transistors 35 and 36. The NV word line NVWL2 is set to HIGH when recalling data from the third pair of NMOS transistors 37 and 38.

Figure 4:
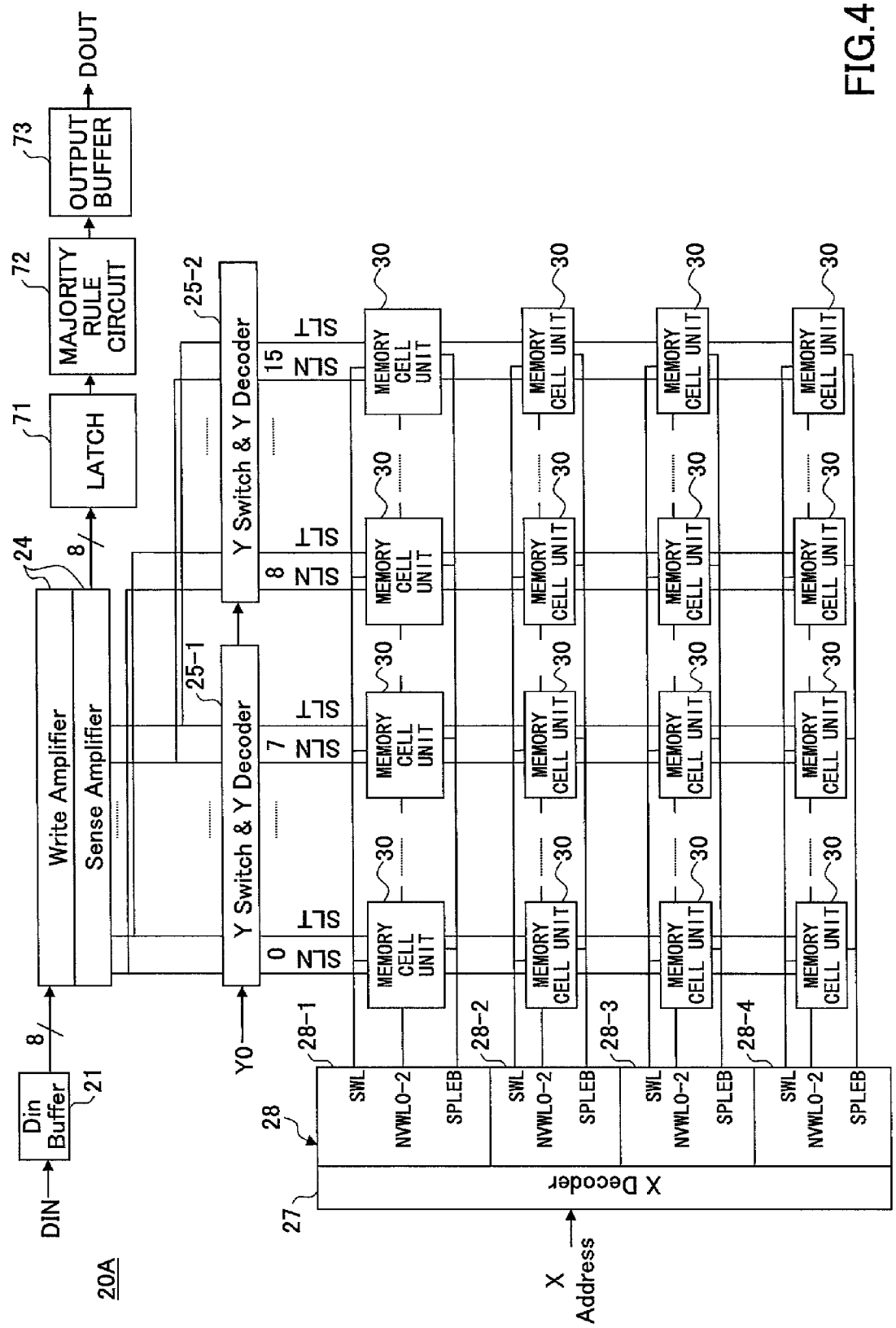
FIG. 4 is a drawing showing the configuration of a first embodiment of the nonvolatile semiconductor memory device according to the present invention.

FIG. 4 is a drawing showing the configuration of a first embodiment of the nonvolatile semiconductor memory device according to the present invention. In FIG. 4, the same elements as those of FIG. 1 and FIG. 2 are referred to by the same numerals, and a description thereof will be omitted. In FIG. 4, the illustration of the timing controller 26 is omitted for the sake of simplicity of illustration.

In a nonvolatile semiconductor memory device 20A, the X driver 28 includes X driver units 28-1 through 28-4 which are identical to one another in terms of circuit configuration. Each one of the X driver units 28-1 through 28-4 supplies a set of signals SWL, NVWL0-2. and SPLEB, and also supplies other signals such as PCNB (not shown) as appropriate.

An address signal supplied to the X decoder 27 may be comprised of 2 bits, for example, to select one of the X driver units 28-1 through 28-4, the number of which is 4 in this example. The memory cell array 29 shown in FIG. 1 corresponds to a plurality of memory cell units 30, the SRAM data lines SLN and SLT extending from the sense-amplifier-&-write-amplifier unit 24 (via Y-switch-&-Y-decoder units 25-1 and 25-2), and signal lines extending from the X driver units 28-1 through 28-4. Each of the memory cell units 30 has the configuration as shown in FIG. 2.

One of the X driver units 28-1 through 28-4 selected by the X decoder 27 activates the SRAM word line SWL to write/read data to/from the SRAM cells 41 (see FIG. 2) of the memory cell units 30 that are connected to the activated SRAM word line SWL. Data transfer between the sense-amplifier-&-write-amplifier unit 24 and the SRAM cells 43 is conducted via the SRAM data lines SLN and SLT and the Y-switch-&-Y-decoder units 25-1 and 25-2. The Y-switch-&-Y-decoder units 25-1 and 25-2 correspond to the Y decoder 23 and the Y switch 25 shown in FIG. 1. In the example shown in FIG. 4, a Y address Y0 is comprised of one bit to indicate one of the two columns wherein the first column is comprised of bits 0 through 7 shown in FIG. 4 corresponding to the Y-switch-&-Y-decoder unit 25-1, and the second column is comprised of bits 8 through 15 shown in FIG. 4 corresponding to the Y-switch-&-Y-decoder unit 25-2. The Din buffer 21 and the sense-amplifier-&-write-amplifier unit 24 have a data width of 8 bits, and this 8-bit data is written/read to/from the memory cell units 30 via a selected one of the Y-switch-&-Y-decoder units 25-1 and 25-2.

The Dout buffer 22 of FIG. 1 corresponds to a latch 71, a majority rule circuit 72, and an output buffer 73. The latch 71 includes three latch circuits each storing 8-bit data sent from the sense-amplifier-&-write-amplifier unit 24. With the three latch circuits, the latch 71 stores three bits for each bit position of the 8-bit data that is to be output from the nonvolatile semiconductor memory device 20A. These three bits correspond to the three bits of the NV cell 42 shown in FIG. 2. The majority rule circuit 72 makes a majority decision based on the three bits stored in the latch 71 to determine a data value for each bit position of the 8-bit data. The output buffer 73 outputs the 8-bit data for which each bit value is determined based on the majority rule to outside the nonvolatile semiconductor memory device 20A.

Figure 5:
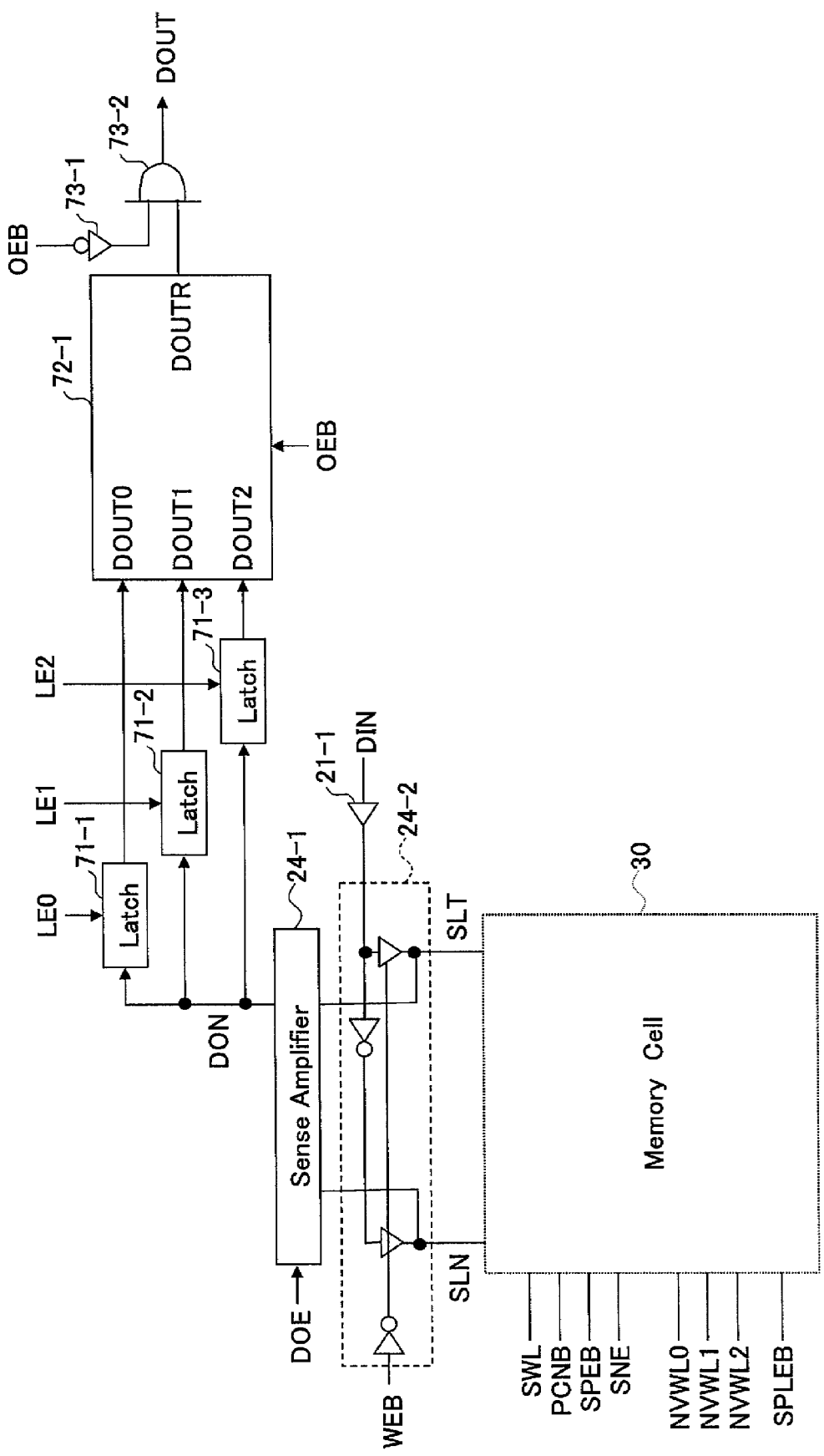
FIG. 5 is a drawing for explaining the writing and reading of data in the nonvolatile semiconductor memory device of FIG. 4.

FIG. 5 is a drawing for explaining the writing and reading of data in the nonvolatile semiconductor memory device 20A. For the sake of simplicity of illustration and explanation, FIG. 5 shows only the writing and reading of a given one bit among a plurality of bits (e.g., 8 bits) that constitute one data word.

A data buffer 21-1 corresponds to one bit of the Din buffer 21, and supplies an input data bit to a write amplifier 24-1, which corresponds to one of the write amplifiers of the sense-amplifier-&-write-amplifier unit 24. In response to the write enable signal WEB, the data bit is supplied from the write amplifier 24-1 to the memory cell unit 30 for storage therein. During data read operation, a first data bit is read from the memory cell unit 30 by activating the nonvolatile word line NVWL0, and is supplied to a sense amplifier 24-1, which F corresponds to one of the sense amplifiers of the sense-amplifier-&-write-amplifier unit 24. The first data bit amplified by the sense amplifier 24-1 is then stored in a latch 71-1 in response to a latch enable signal LE0. A second data bit is read from the memory cell unit 30 by activating the nonvolatile word line NVWL1, and is amplified by the sense amplifier 24-1, followed by being stored in a latch 71-2 in response to a latch enable signal LE1. A third data bit is read from the memory cell unit 30 by activating the nonvolatile word line NVWL2, and is amplified by the sense amplifier 24-1, followed by being stored in a latch 71-3 in response to a latch enable signal LE2. The three latches 71-1 through 71-3 correspond to one bit position of the latch 71.

A majority rule unit 72-1, which corresponds to one bit of the majority rule circuit 72, makes a majority decision based on three bits DOUT0 through DOUT2 supplied from the latches 71-1 through 71-3, respectively, to determine a bit value of the one bit data. The majority rule unit 72-1 supplies the determined bit value as an output DOUTR to an AND gate 73-2. When the output enable signal OEB input to a gate 73-1 is LOW, the AND gate 73-2 outputs the determined bit value as a data output DOUT.

Figure 6:
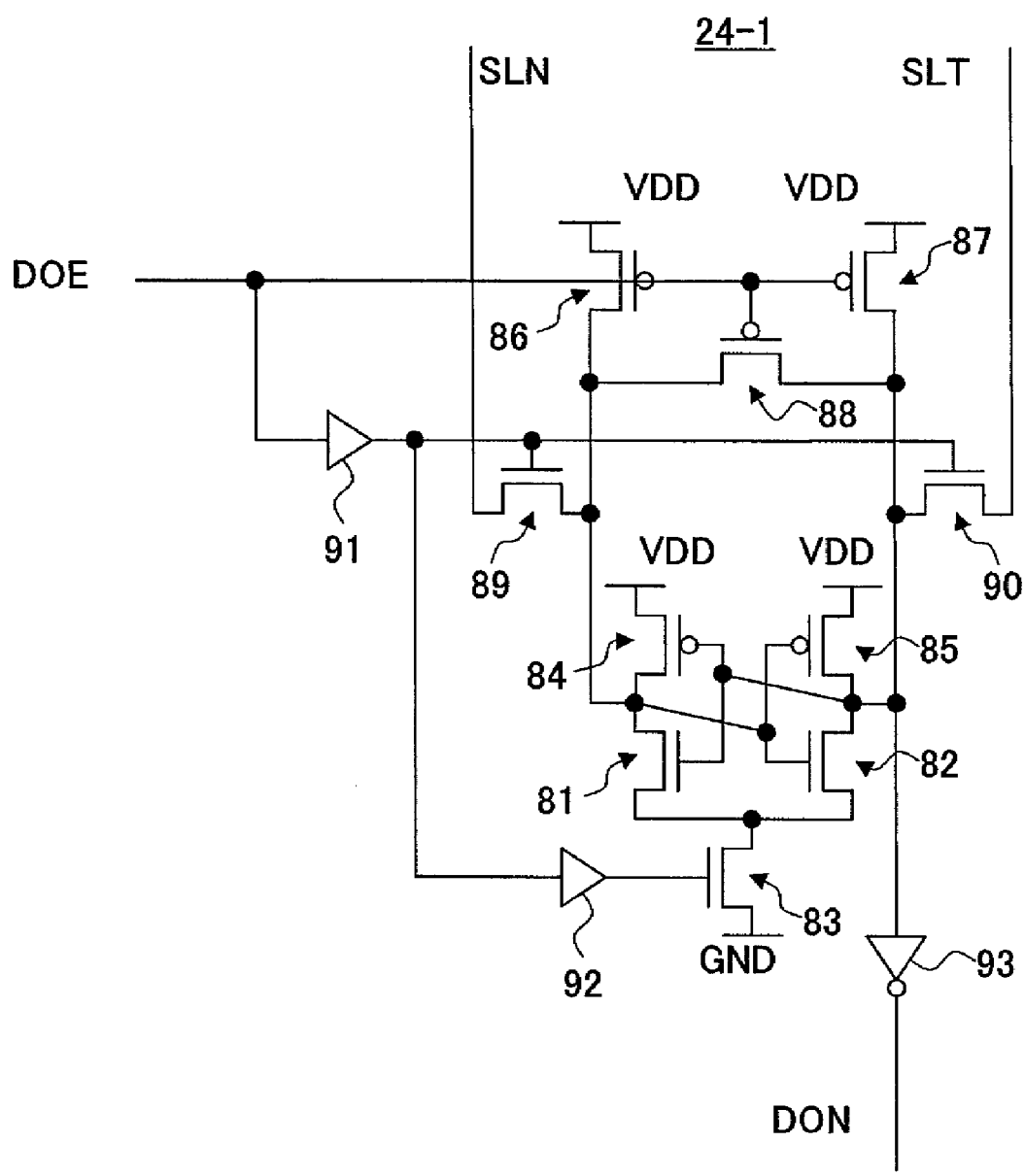
FIG. 6 is a drawing showing an example of the circuit configuration of a sense amplifier.

FIG. 6 is a drawing showing an example of the circuit configuration of the sense amplifier 24-1. As shown in FIG. 6, the sense amplifier 24-1 includes NMOS transistors 81 through 83, PMOS transistors 84 through 88, NMOS transistors 89 and 90, buffers 91 and 92, and an inverter 93. When DOE is LOW, the PMOS transistors 86 through 88 become conductive to equalize and precharge the sense amplifier 24-1. When DOE is HIGH, the NMOS transistor 83 becomes conductive to activate the sense amplifier 24-1.

Due to the nature of the store and recall operation, HIGH data DIN (i.e., HIGH on the SRAM data line SLT and LOW on the SRAM data line SLN) written to the SRAM cell 41 and stored in the NV cell 42 will appear as LOW data (i.e., LOW on the SRAM data line SLT and HIGH on the SRAM data line SLN) when the data is recalled from the NV cell 42 to the SRAM cell 41. Considering such data inversion, the inverter 93 shown in FIG. 6 inverts the data recalled from the NV cell 42, so that data DON output from the sense amplifier 24-1 should be the same logic as the data DIN that was originally written to the SRAM cell 41.

Figures 7, 8:
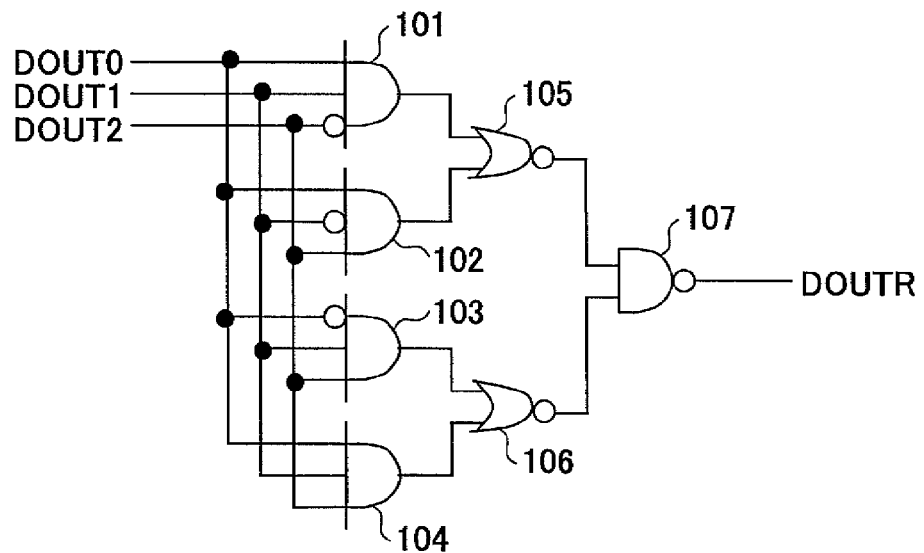
FIG. 7 is a drawing showing an example of the configuration of a majority rule unit.
FIG. 8 is a truth table showing the relationships between input bits DOUT0 through DOUT2 and a determined bit value of the majority rule unit shown in FIG. 7.

FIG. 7 is a drawing showing an example of the configuration of the majority rule unit 72-1. The majority rule unit 72-1 includes AND gates 101 through 104, NOR gates 105 and 106, and a NAND gate 107. An open circle on the input side of the NAND gates 101 through 103 indicates that a corresponding one of the three input bits DOUT0 through DOUT2 is inverted before it is input. The NAND gate 107 produces a bit value DOUTR that is determined based on the majority rule.

FIG. 8 is a truth table showing the relationships between the input bits DOUT0 through DOUT2 and the determined bit value DOUTR of the majority rule unit 72-1 shown in FIG. 7. As shown in FIG. 8, the determined bit value DOUTR is HIGH when the majority (i.e., no fewer than two in this case) of the input bits are HIGH.

Figure 9:
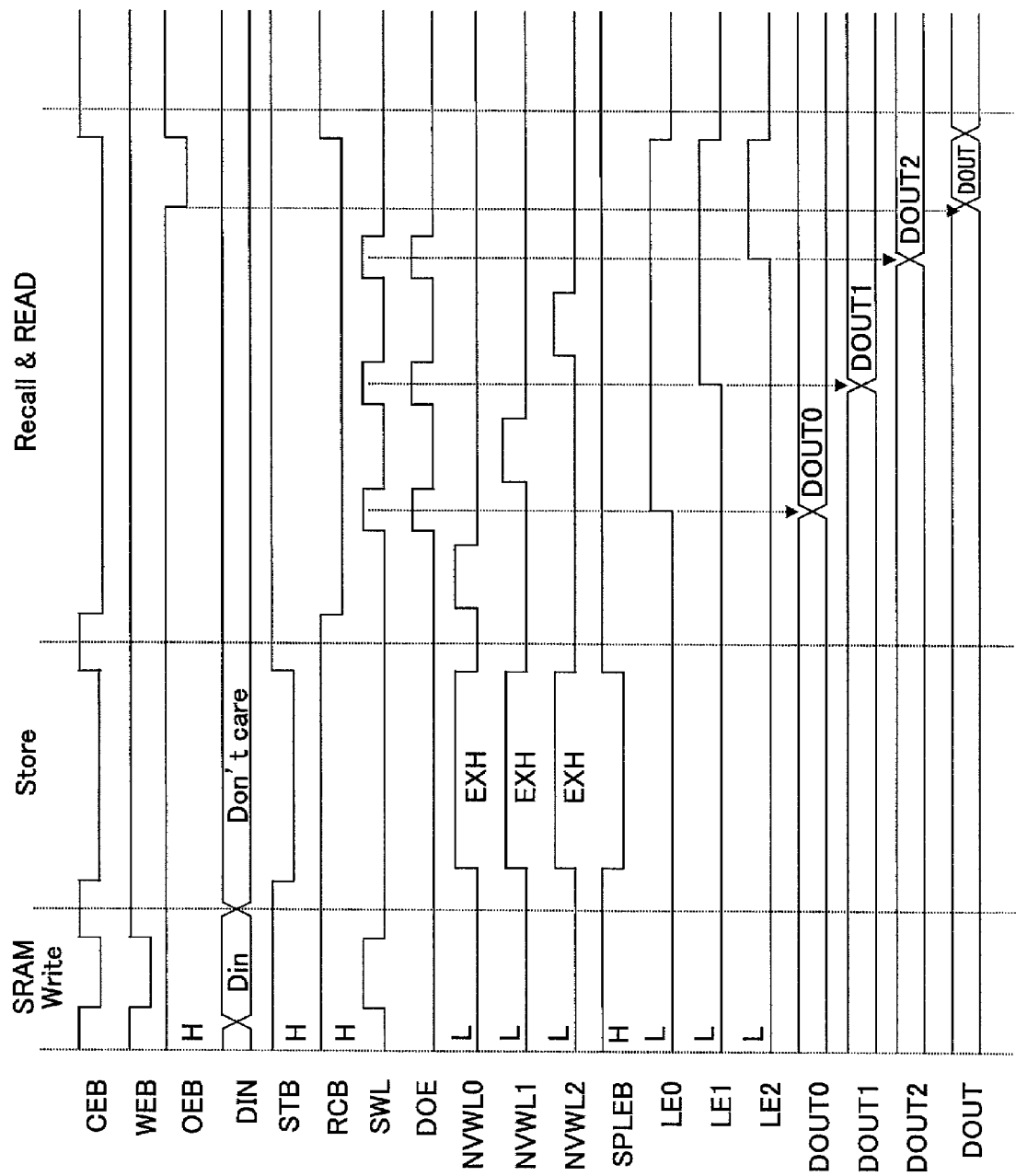
FIG. 9 is a timing chart for explaining operations of the nonvolatile semiconductor memory device shown in FIG. 4.

FIG. 9 is a timing chart for explaining operations of the nonvolatile semiconductor memory device 20A shown in FIG. 4.

The first operation shown in FIG. 9 is an SRAM write operation that writes data to specified SRAM cells 41. The store enable signal STB, the output enable signal OEB, and the recall enable signal RCB are kept at HIGH, and the write enable signal WEB and the chip enable signal CEB are set to LOW to specify write timing. At this write timing, an address (not shown) and data DIN are supplied to the nonvolatile semiconductor memory device 20A.

Referring to FIG. 4, an X address is supplied to the X decoder 27, and the Y address Y0 is supplied to the Y-switch-&-Y-decoder units 25-1 and 25-2. The input data DIN is supplied to the Din buffer 21. In response to the supplied X address, the X driver unit 28-1, for example, is selected by the X decoder 27 to activate the SRAM word line SWL extending from the X driver unit 28-1. In response to the supplied Y address Y0, the Y-switch-&-Y-decoder unit 25-1, for example, couples the sense-amplifier-&-write-amplifier unit 24 to the memory cell units 30 corresponding to data bits 0 through 7 shown in FIG. 4. The activation of the SRAM word line SWL to HIGH causes the input data to be written to the SRAM cells 41 of the memory cell units 30 corresponding to the data bits 0 through 7 shown in FIG. 4.

Turning back to FIG. 9, the second operation shown in FIG. 9 is a store operation that stores the data of the SRAM cells 41 in the NV cells 42. The store enable signal STB and the chip enable signal CEB are set to LOW while the output enable signal OEB, the recall enable signal RCB, and the write enable signal WEB are set to HIGH.

In the store operation, the store plate voltage enable line SPLEB is set to LOW, which makes the PMOS transistor 40 conductive (see FIG. 2), thereby applying the high voltage VPP (e.g., 3.3 V) to the NV cells 42. The NV word lines NVWL0 through NVWL2 are all set to EXH (e.g., 1.65 V), which is determined such as to maximize the effect of a hot-carrier phenomenon.

With the signal level settings as described above, with respect to each of the memory cell units 30, a voltage of 3.3 V between VPP and the LOW level (i.e., 0 V) is applied between the drain node and source node of one of the paired NMOS transistors, whichever is selected according to the data stored in the SRAM cell 41. If the node /C is LOW and the node C is HIGH in FIG. 2, for example, the NMOS transistors 33, 35 and 37 receive 3.3 V between their drain node and source node.

Further, a voltage of 1.65 V between the NV word line potential and the LOW level is applied between the gate nodes and source nodes of these NMOS transistors 33, 35, and 37. Since these bias voltages are larger than the voltages used in routine operations, the NMOS transistors 33, 35, and 37 experience a strong hot-carrier effect while the NMOS transistors 34, 36, and 38 do not experience a hot-carrier effect.

Turning back to FIG. 9, the third operation shown in FIG. 9 is a recall-&-read operation that recalls the data stored in the NV cells 42 to the SRAM cells 41 and reads the data of the SRAM cells 41 for output from the nonvolatile semiconductor memory device 20A. The store enable signal STB, the output enable signal OEB, and the write enable signal WEB are kept at HIGH, and the recall enable signal RCB and the chip enable signal CEB are set to LOW to initiate a recall-&-read operation.

In the recall-&-read operation, the store plate voltage enable line SPLEB is set to HIGH, and the NV word line NVWL0 is first set to HIGH to read the first one of the three bits stored in each of the NV cells 42. In order to recall the data from the NV cells 42, the SRAM cells 41 are initially placed in an electrically inactive state, and are then shifted to an electrically active state.

Referring to FIG. 2, the NMOS transistor 33 may have a change in the transistor characteristics (i.e., an increase in the threshold voltage) due to a hot-carrier effect whereas the NMOS transistor 34 does not have such a change in the transistor characteristics. In such a case, the force that pulls down the node /C is weaker than the force that pulls down the node C. After the activation of the SRAM cell 41, therefore, the node /C is set to the HIGH level, and the node C is set to the LOW level.

Turning back to FIG. 9, DOE and SWL are both set to HIGH after the first one of the three bits is transferred from the NV cells 42 to the SRAM cells 41. A selective activation of one of the SRAM word lines SWL causes the data of the SRAM cells 41 corresponding to the selected row to be read from the memory cell array 29 (see FIG. 2 and FIG. 4). Further, the sense amplifier 24-1 is activated in response to the HIGH state of DOE (see FIG. 5 and FIG. 6).

Turning back to FIG. 9, the latch enable signal LE0 is changed to HIGH while DOE is HIGH. This causes the latch 71-1 to latch the data DON output from the sense amplifier 24-1 (see FIG. 5). In FIG. 9, the latching of the data by the latch 71-1 appears as a change of the data state of data DOUT0, which is the output of the latch 71-1.

The above-described data recall-&-read operation for the first bit is repeated in the same manner for the second and third bits of the three bits stored in the NV cells 42 as shown in FIG. 9. As a result, all the three bits of a relevant NV cell 42 are stored in the latches 71-1 through 71-2 as the data DOUT0 through DOUT2.

After this, the output enable signal OEB is set to LOW to output the data DOUT from the nonvolatile semiconductor memory device 20A. FIG. 5 may be referred to for the detail of this operation. In response to the LOW state of OEB, the gate 73-2 allows the output of the majority rule unit 72-1 to be supplied as the output data DOUT.

In the first embodiment of the nonvolatile semiconductor memory device described above, a majority decision is made after the data is retrieved from the memory cell array 29.

Alternatively, each memory cell of the memory cell array 29 may be provided with the function to make a majority decision. Such embodiment will be described below.

Figure 10:
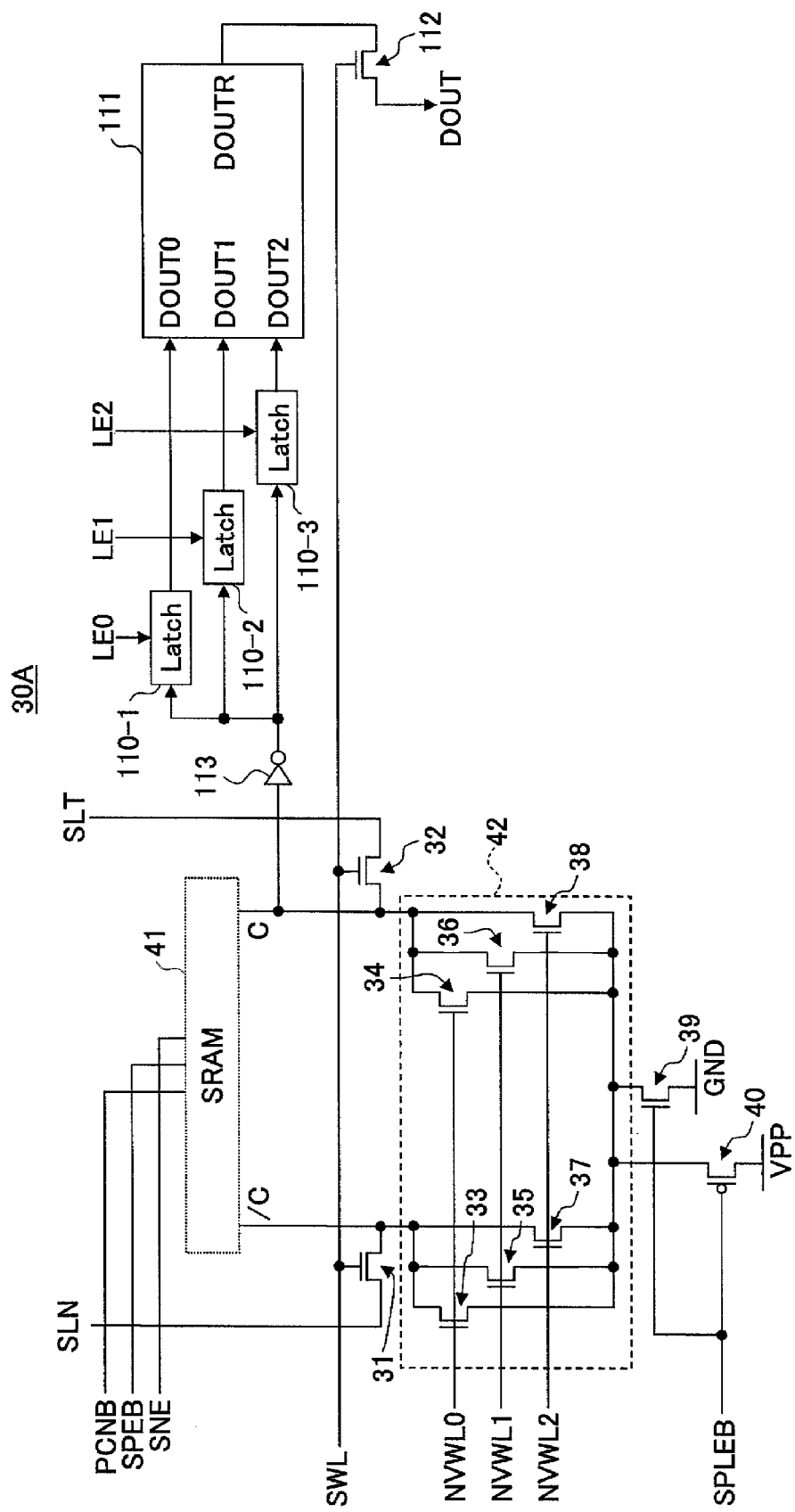
FIG. 10 is a drawing showing an example of the configuration of a memory cell unit that is provided with a majority decision function.

FIG. 10 is a drawing showing an example of the configuration of a memory cell unit that is provided with the majority decision function. In FIG. 10, the same elements as those of FIG. 2 are referred to by the same numerals, and a description thereof will be omitted.

A memory cell unit 30A shown in FIG. 10 includes the NMOS transistors 31 through 39, the PMOS transistor 40, and the SRAM cell 41, which are the same as those shown in FIG. 2. The memory cell unit 30A further includes latches 110-1 through 110-3, a majority rule unit 111, an NMOS transistor 112, and an inverter 113.

Any data that is recalled from the NV cell 42 to the SRAM cell 41 is inverted by the inverter 113, which achieves the same function as the inverter 93 shown in FIG. 6. A first data bit recalled and inverted in this manner is stored in the latch 110-1 in response to a latch enable signal LE0. A second data bit recalled and inverted is stored in the latch 110-2 in response to a latch enable signal LE1. A third data bit recalled and inverted is stored in the latch 110-3 in response to a latch enable signal LE2.

The majority rule unit 111 makes a majority decision based on three bits DOUT0 through DOUT2 supplied from the latches 110-1 through 110-3, respectively, to determine a bit value of the one bit data stored in this memory cell unit 30A. When the SRAM word line SWL is HIGH, the output of the majority rule unit 111 is read as an output DOUT from the memory cell unit 30A via the NMOS transistor 112. The majority rule unit 111 may have the same configuration as the majority rule unit 72-1 shown in FIG. 7.

Figure 11:
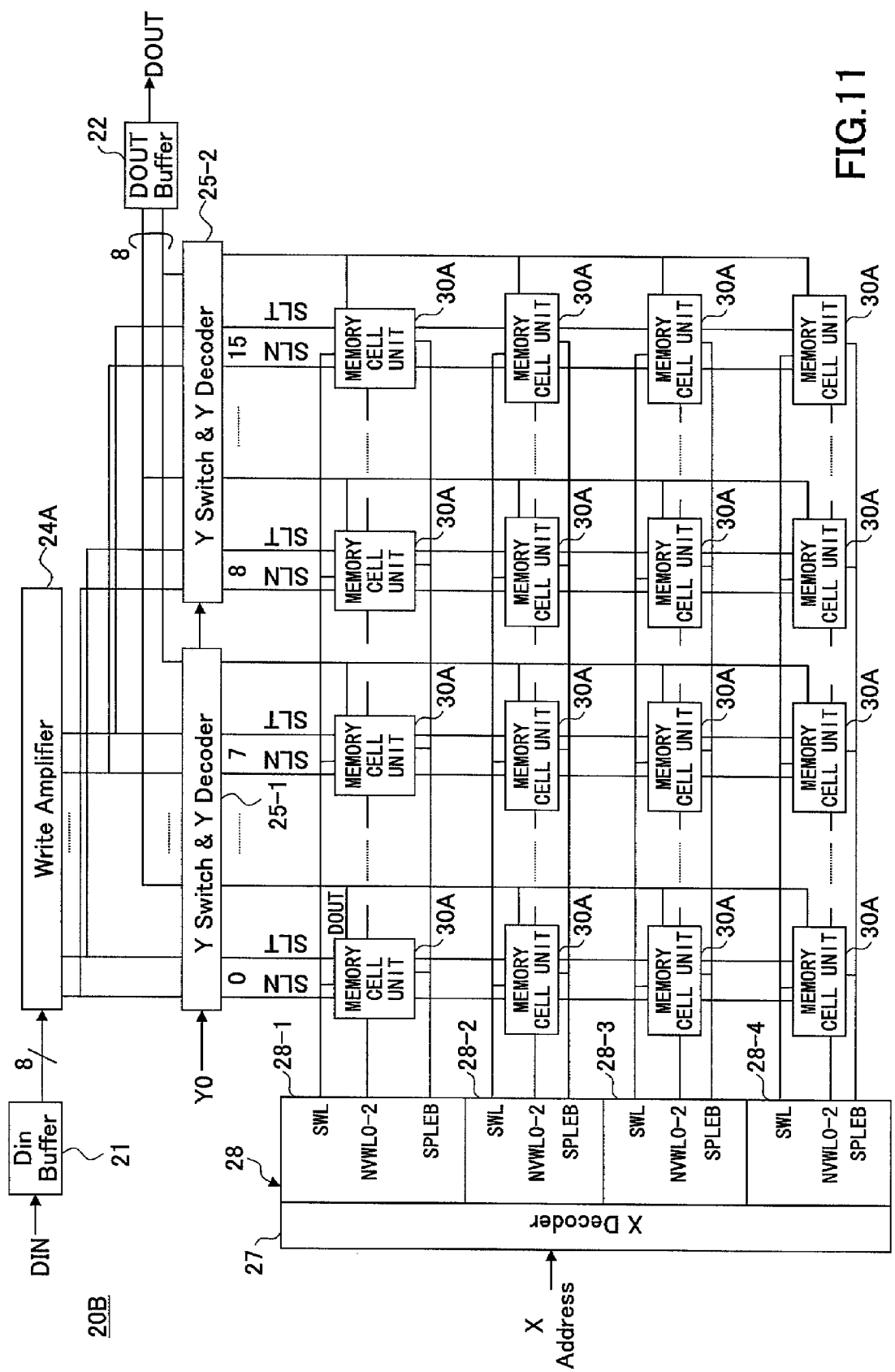
FIG. 11 is a drawing showing the configuration of a second embodiment of the nonvolatile semiconductor memory device according to the present invention.

FIG. 11 is a drawing showing the configuration of a second embodiment of the nonvolatile semiconductor memory device according to the present invention. In FIG. 11, the same elements as those of FIG. 1 and FIG. 4 are referred to by the same numerals, and a description thereof will be omitted. In FIG. 11, the illustration of the timing controller 26 is omitted for the sake of simplicity of illustration.

A nonvolatile semiconductor memory device 20B shown in FIG. 11 differs from the nonvolatile semiconductor memory device 20A shown in FIG. 4 mainly in that the majority decision function is incorporated in each of a plurality of memory cell units 30A. Along with this change, the Dout buffer 22 replaces the latch 71, the majority rule circuit 72, and the output buffer 73 shown in FIG. 4, and serves as a normal buffer without the majority decision function. Further, the sense amplifiers of the sense-amplifier-&-write-amplifier unit 24 shown in FIG. 4 (i.e., the sense amplifier 241 shown in FIG. 6, for example) are no longer necessary. In FIG. 11, sense amplifiers are not provided, and a write amplifier unit 24A is provided in place of the sense-amplifier-&-write-amplifier unit 24.

Figure 12:
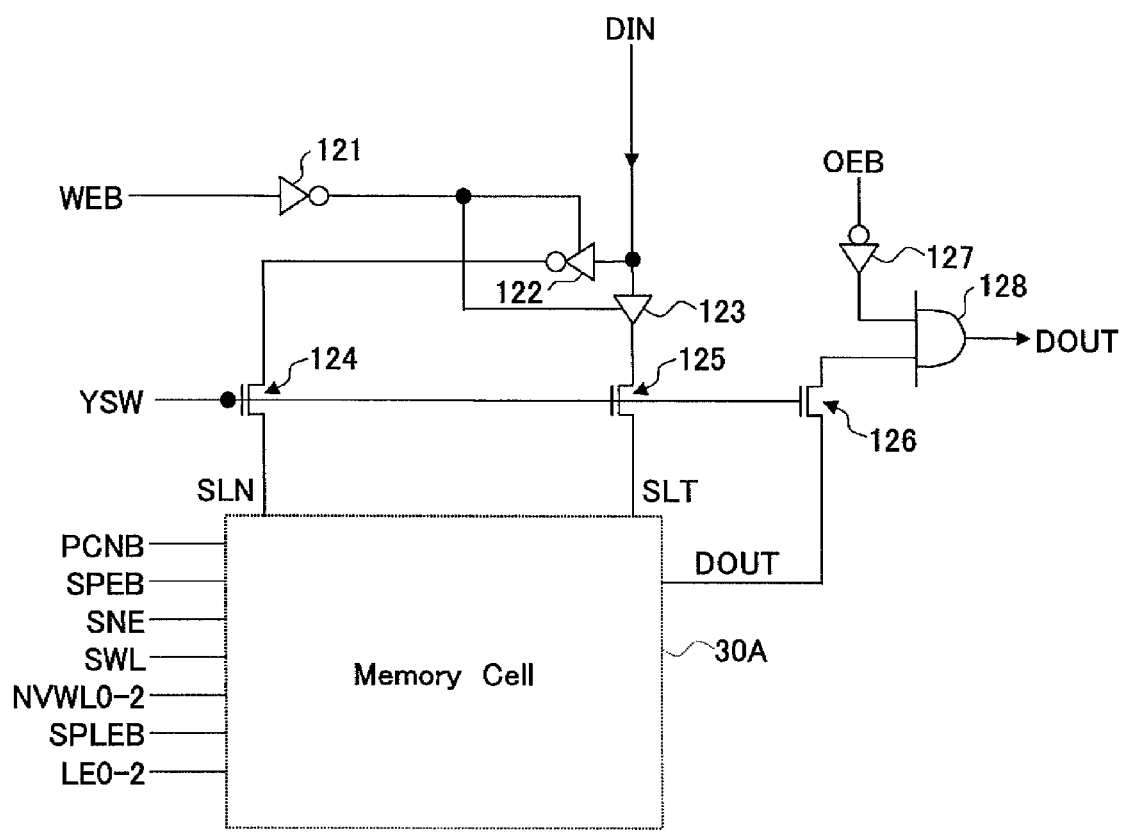
FIG. 12 is a drawing for explaining the writing and reading of data in the nonvolatile semiconductor memory device of FIG. 11.

FIG. 12 is a drawing for explaining the writing and reading of data in the nonvolatile semiconductor memory device 20B. For the sake of simplicity of illustration and explanation, FIG. 5 shows only the writing and reading of a given one bit among a plurality of bits (e.g., 8 bits) that constitute one data word.

An inverter 121, an inverter 122, and a buffer 123 correspond to a portion for one bit of the write amplifier unit 24A. The inverter 121 receives the write enable signal WEB at its input, and supplies its output to the inverter 122 and the buffer 123 to drive these devices. An inverter 127 and an AND gate 128 correspond to a portion for one bit of the Dout buffer 22. The inverter 127 receives the output enable signal OEB. The output of the inverter 127 is coupled to one of the two inputs of the AND gate 128. The other input of the AND gate 128 receives the output data DOUT from the memory cell unit 30A.

NMOS transistors 124 through 126 correspond to a portion for one bit of the Y-switch-&-Y-decoder unit 25-1 and Y-switch-&-Y-decoder unit 25-2. When a Y switch signal YSW responsive to the Y address input is HIGH, write access to the corresponding memory cell unit 30A is performed via the NMOS transistors 124 and 125, and read access to the corresponding memory cell unit 30A is performed via the NMOS transistor 126.

In response to the LOW state of the write enable signal WEB, the input data DIN is supplied to the memory cell unit 30A for storage therein. In response to the LOW state of the output enable signal OEB, the data DOUT retrieved from the memory cell unit 30A is output to outside the nonvolatile semiconductor memory device 20B as shown in FIG. 11.

Figure 13:
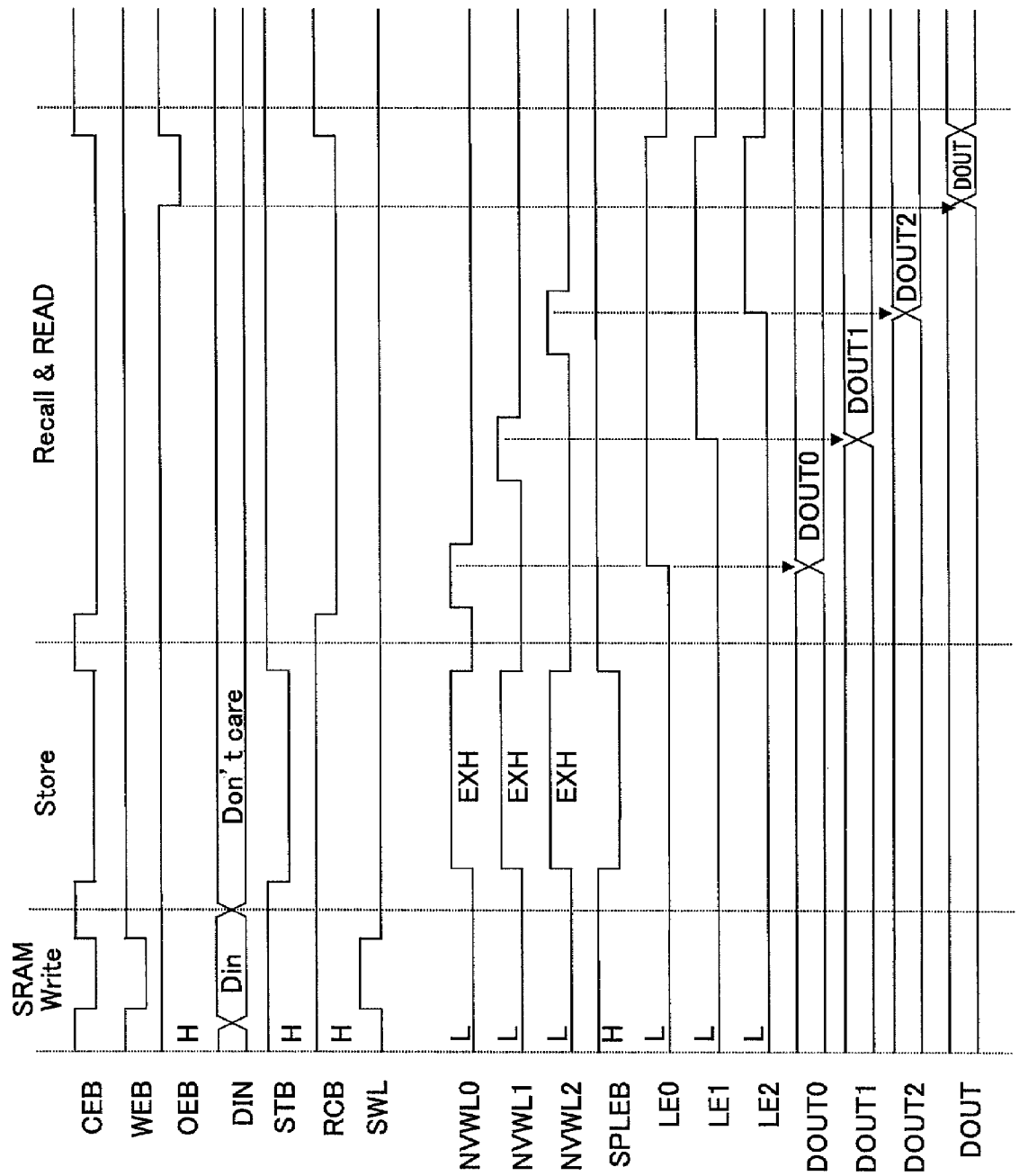
FIG. 13 is a timing chart for explaining operations of the nonvolatile semiconductor memory device shown in FIG. 11.

FIG. 13 is a timing chart for explaining operations of the nonvolatile semiconductor memory device 20B shown in FIG. 11. The SRAM write operation, store operation, and recall-&-read operation of the nonvolatile semiconductor memory device 20B shown in FIG. 13 are substantially the same as those of the nonvolatile semiconductor memory device 20A shown in FIG. 9. The signal DOE shown in FIG. 91 however, is nonexistent in the case of the second embodiment.

Figure 14:
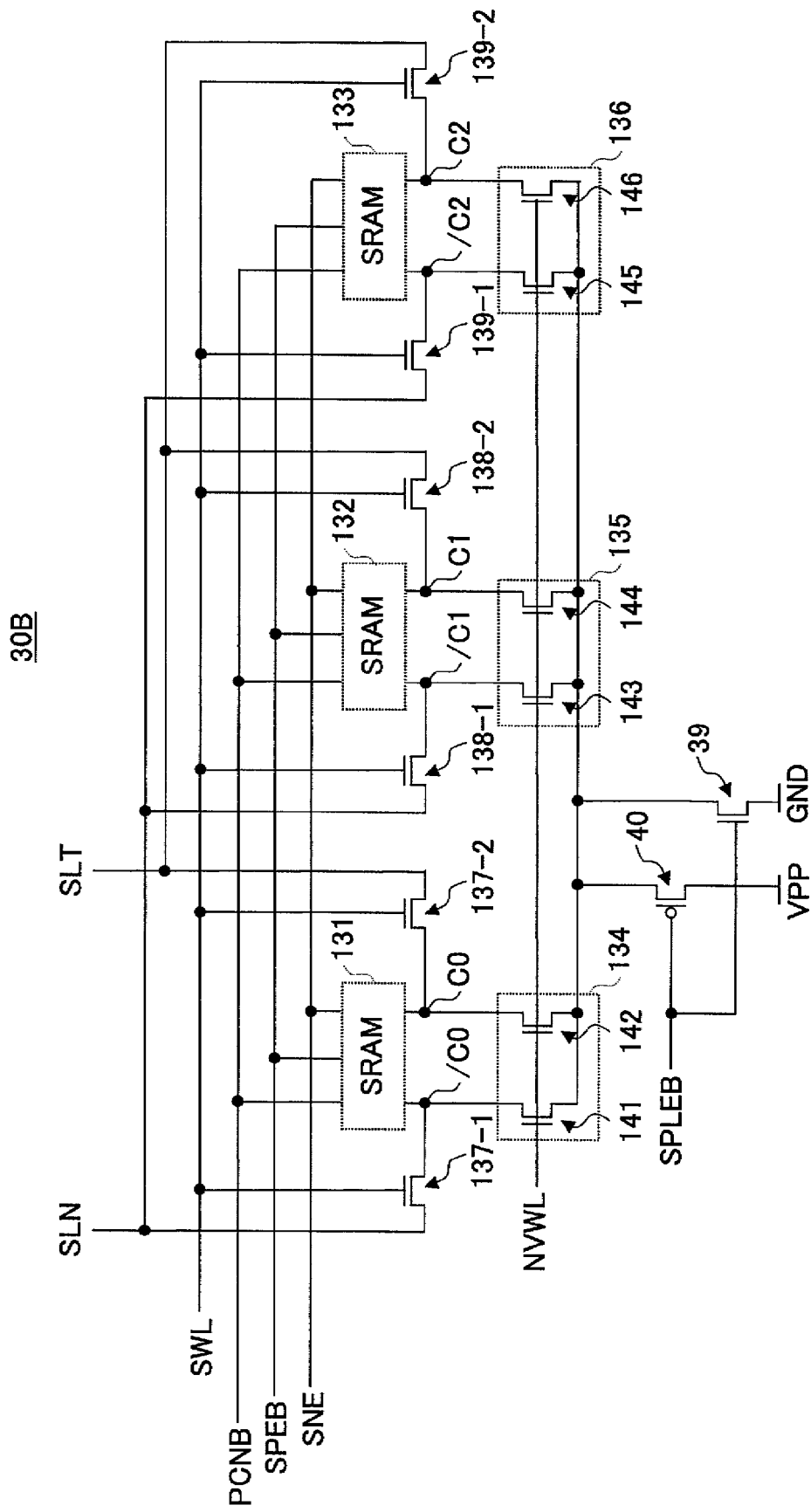
FIG. 14 is a drawing showing another example of the configuration of a memory cell unit that is provided with the majority decision function.

FIG. 14 is a drawing showing another example of the configuration of a memory cell unit that is provided with the majority decision function. In FIG. 14, the same elements as those of FIG. 2 are referred to by the same numerals, and a description thereof will be omitted.

A memory cell unit 30B shown in FIG. 14 includes SRAM cells 131 through 133, NV cells 134 through 136, NMOS transistors 137-1 and 137-2, NMOS transistors 138-1 and 138-2, NMOS transistors 139-1 and 139-2, an NMOS transistor 40, and a PMOS transistor 39. The NV cell 134 includes a pair of NMOS transistors 141 and 142. The NV cell 135 includes a pair of NMOS transistors 143 and 144. The NV cell 136 includes a pair of NMOS transistors 145 and 146. The NV cells 134 through 136 may collectively be regarded as a single NV cell for storing one-bit data for this memory cell unit 30B. The SRAM cell 131 serves as a data latch/sense circuit for the NV cell 134. The SRAM cell 132 serves as a data latch/sense circuit for the NV cell 135. The SRAM cell 133 serves as a data latch/sense circuit for the NV cell 136.

In the memory cell unit 30B, majority decision making is performed by use of the three SRAM cells 131 through 133. As shown in FIG. 14, these three SRAM cells 131 through 133 are coupled to and share the same SARM data lines SLN and SLT. When the SRAM word line SWL is set to HIGH, all the three SRAM cells 131 through 133 are electrically connected to the SARM data lines SLN and SLT. If one of the three SRAM cells 131 through 133 holds a data bit value different from that of the other two, the data bit value held by these other two SRAM cells will dominate (win) and appear on the SARM data lines SLN and SLT. A majority rule thus determines a bit value read from this memory cell unit 30B.

Figure 15:
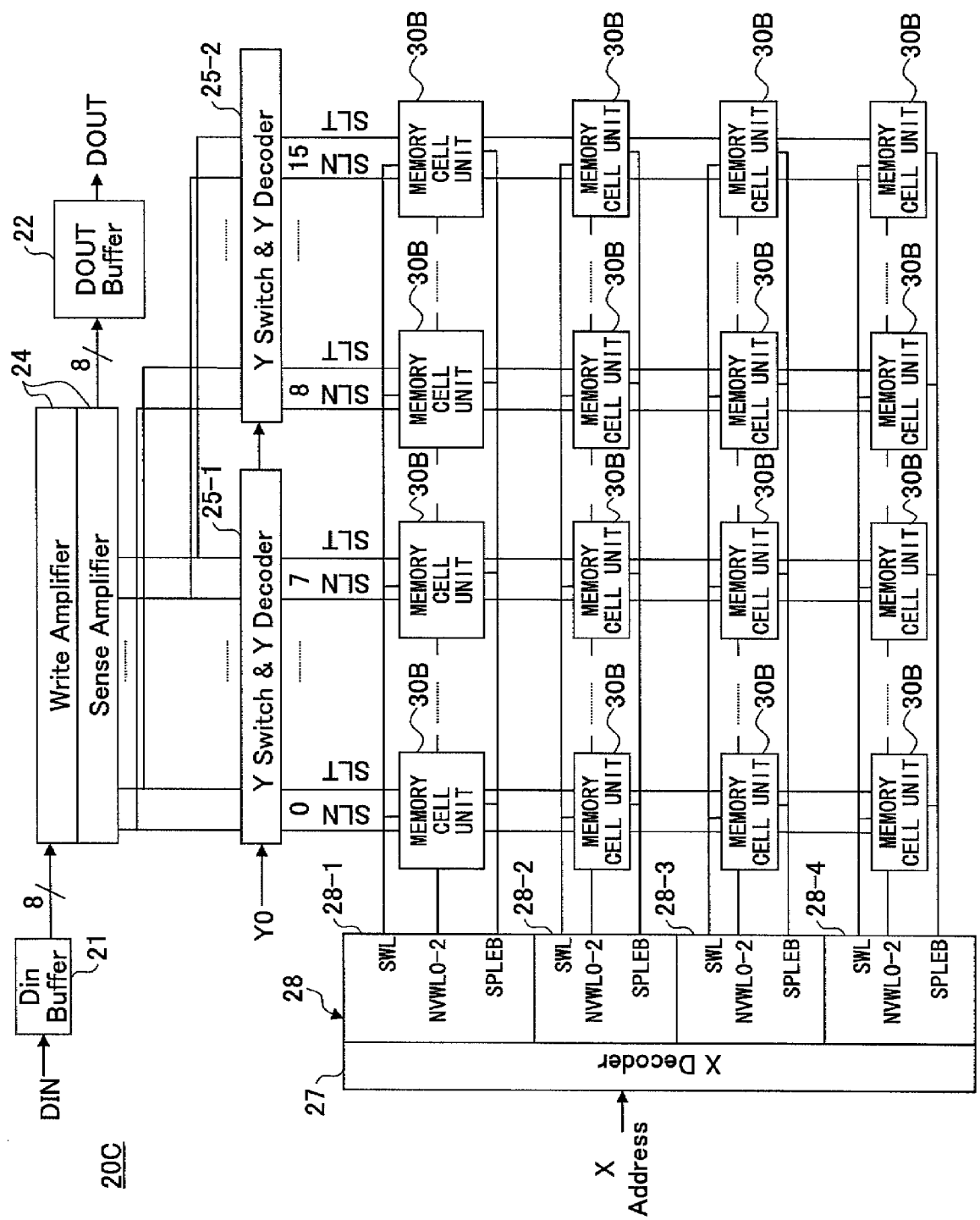
FIG. 15 is a drawing showing the configuration of a third embodiment of the nonvolatile semiconductor memory device according to the present invention.

FIG. 15 is a drawing showing the configuration of a third embodiment of the nonvolatile semiconductor memory device according to the present invention. In FIG. 15, the same elements as those of FIG. 1, FIG. 4, and FIG. 11 are referred to by the same numerals, and a description thereof will be omitted. In FIG. 15, the illustration of the timing controller 26 is omitted for the sake of simplicity of illustration.

A nonvolatile semiconductor memory device 20C shown in FIG. 15 differs from the nonvolatile semiconductor memory device 20A shown in FIG. 4 mainly in that the majority decision function is incorporated in each of a plurality of memory cell units 30B. Along with this change, the Dout buffer 22 replaces the latch 71, the majority rule circuit 72, and the output buffer 73 shown in FIG. 4, and serves as a normal buffer without the majority decision function.

Figure 16:
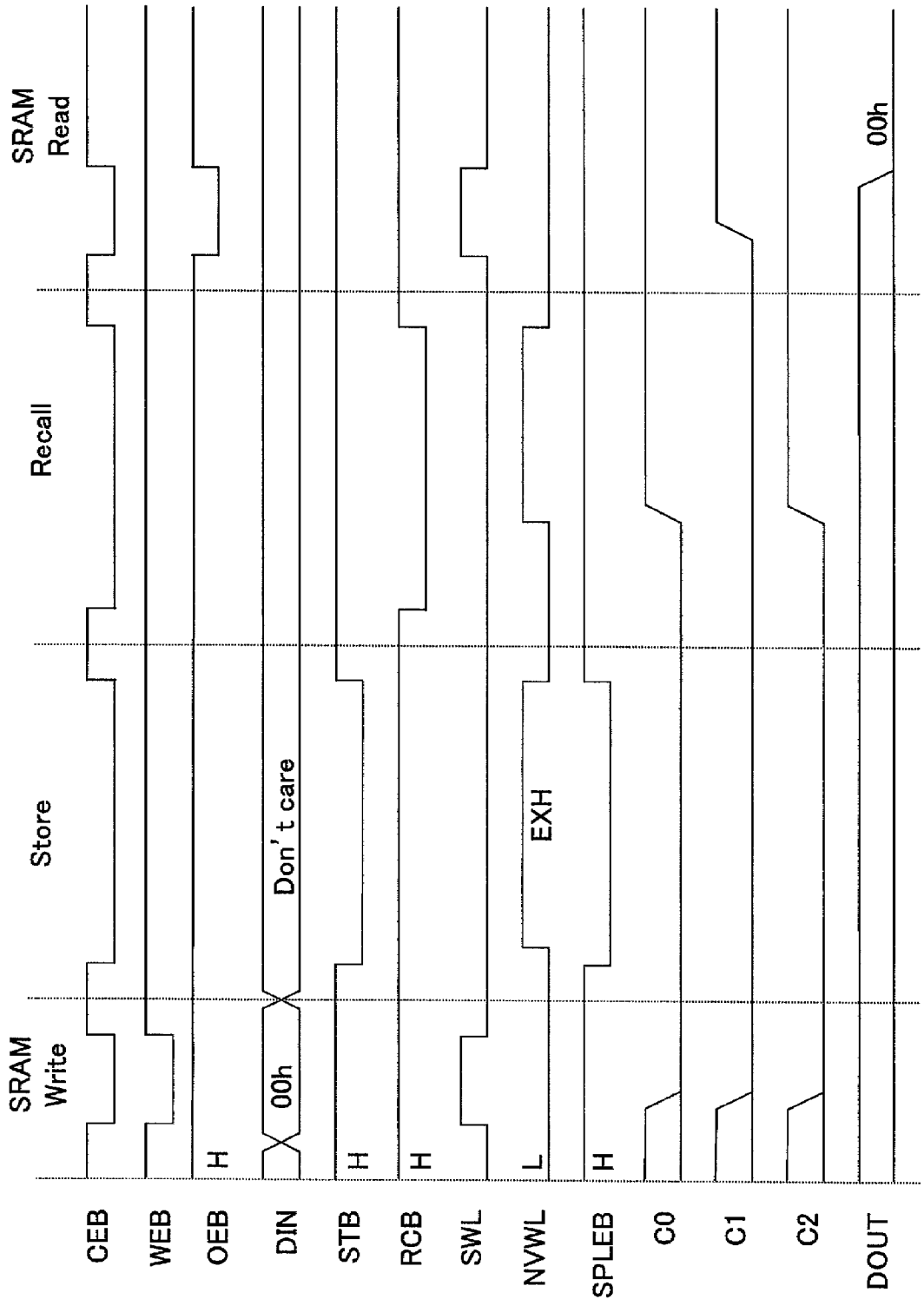
FIG. 16 is a timing chart for explaining operations of the nonvolatile semiconductor memory device shown in FIG. 15.

FIG. 16 is a timing chart for explaining operations of the nonvolatile semiconductor memory device 20C shown in FIG. 15.

The first operation shown in FIG. 16 is an SRAM write operation that writes data to specified SRAM cells 41. This SRAM write operation is substantially the same as the SRAM write operation described in connection with FIG. 16. In the example shown in FIG. 16, the input data DIN is "00h", so that nodes C0 through C2 (see FIG. 14) are all set to LOW in response to the SRAM write operation.

The second operation shown in FIG. 16 is a store operation that stores the data of the SRAM cells 131 through 133 in the NV cells 134 through 136, respectively. This store operation is substantially the same as the store operation described in connection with FIG. 9, except that a single NV word line NVWL shown in FIG. 14, rather than the three NV word lines NVWL0-2 shown in FIG. 2, is set to EXT.

Figure 17:
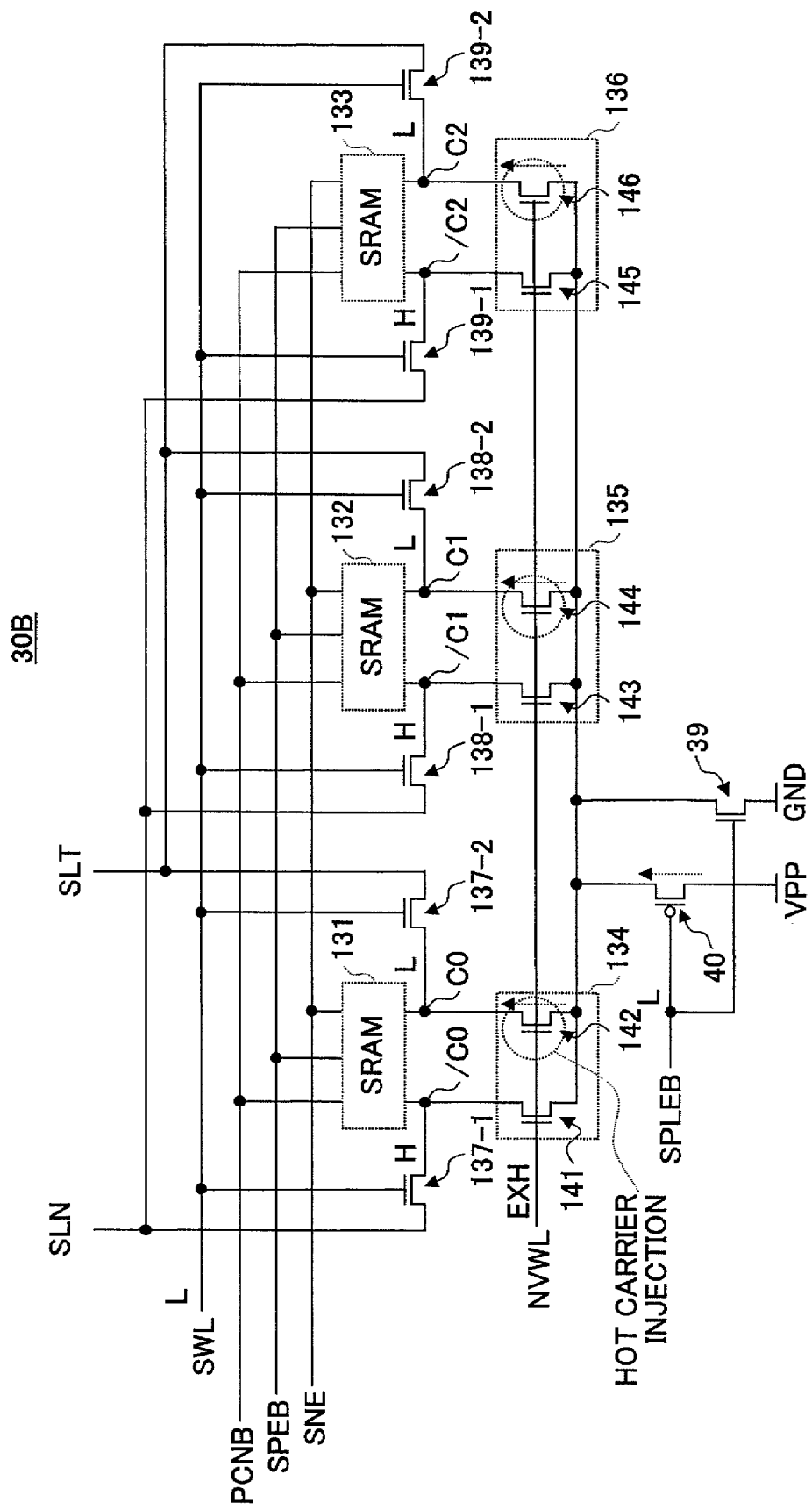
FIG. 17 is a drawing for explaining the data store operation of the memory cell unit shown in FIG. 14.

FIG. 17 is a drawing for explaining the data store operation of the memory cell unit 30B shown in FIG. 14. In FIG. 17, the same elements as those of FIG. 14 are referred to by the same numerals, and a description thereof will be omitted. As shown in FIG. 17, the node C0 and /C0 of the SRAM cell 131 are set to LOW and HIGH, respectively. By the same token, the node C1 and /C1 of the SRAM cell 132 are set to LOW and HIGH, respectively, and the node C2 and /C2 of the SRAM cell 133 are set to LOW and HIGH, respectively.

The store plate voltage enable line SPLEB is set to LOW, and the NV word line NVWL is set to EXH. As a result, the NMOS transistors 142, 144, and 146 experience a hot carrier effect, by which hot carriers (electrons) are injected into the oxide films of these transistors.

Turning back to FIG. 16, the third operation is a recall operation that recalls the data of the NV cells 134 through 136 to the SRAM cells 131 through 133, respectively. The store enable signal STB, the output enable signal OEB, and the write enable signal WEB are kept at HIGH, and the recall enable signal RCB and the chip enable signal CEB are set to LOW to indicate a recall operation. In the recall operation, the store plate voltage enable line SPLEB is set to HIGH, and the NV word line NVWL is set to HIGH, so that the SRAM cells 131 through 133 sense the data stored in the NV cells 134 through 136, respectively.

Figure 18:
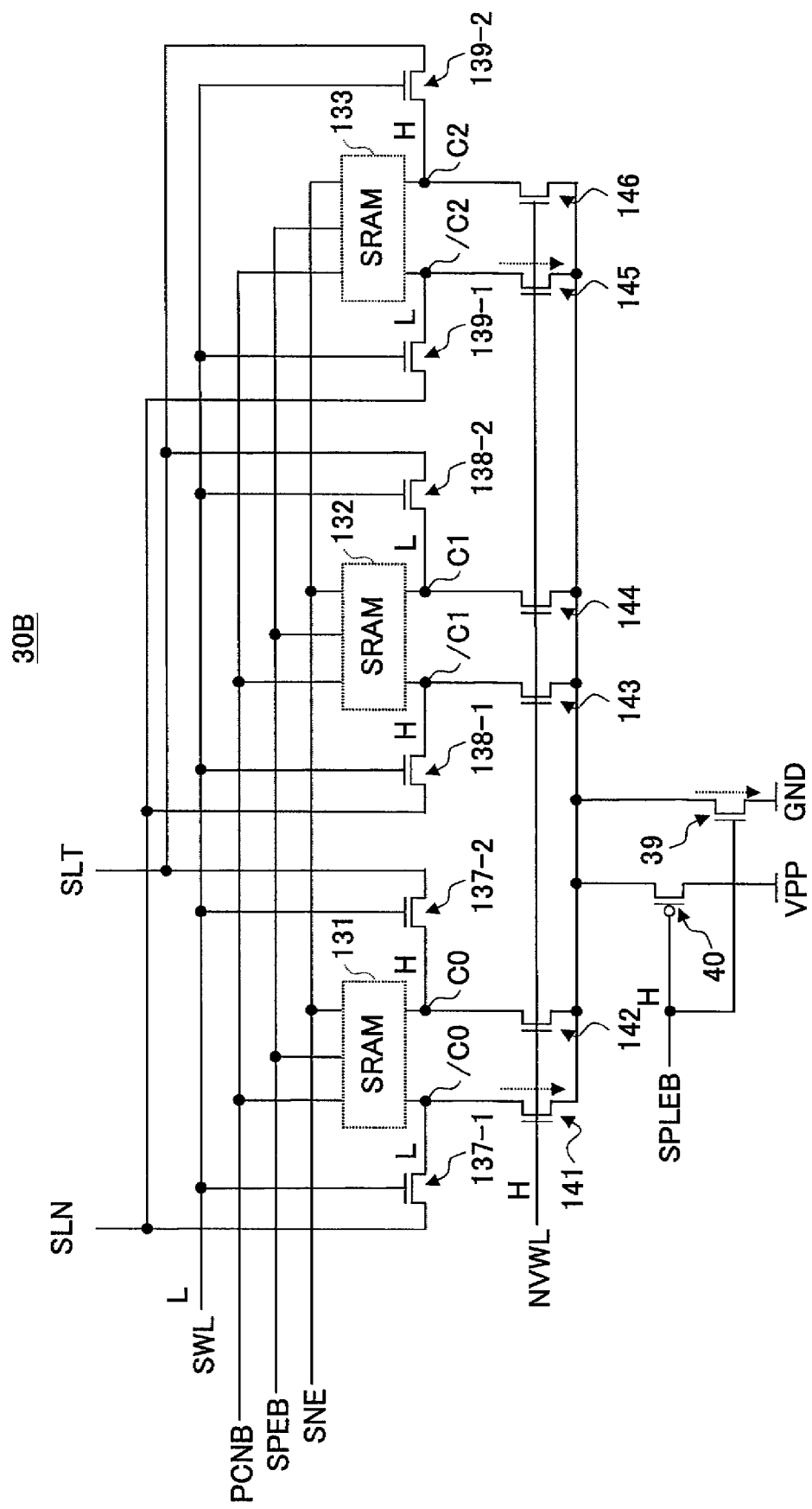
FIG. 18 is a drawing for explaining the data recall operation of the memory cell unit shown in FIG. 14.

FIG. 18 is a drawing for explaining the data recall operation of the memory cell unit 30B shown in FIG. 14. In FIG. 18, the same elements as those of FIG. 14 are referred to by the same numerals, and a description thereof will be omitted. As shown in FIG. 18, the store plate voltage enable line SPLEB is set to HIGH, and the NV word line NVWL is set to HIGH, thereby causing the SRAM cells 131 through 133 to latch the data responsive to differences in the threshold voltages of the NMOS transistors 141 through 146. As a result of this recall operation, the node C0 and /C0 of the SRAM cell 131 are set to HIGH and LOW, respectively, and the node C2 and /C2 of the SRAM cell 133 are also set to HIGH and LOW, respectively. However, the node C1 and /C1 of the SRAM cell 132 are set to LOW and HIGH, respectively, which is a bit error caused by an insufficient change in the threshold voltage of the NMOS transistor 144. This bit error is also shown in FIG. 16 as the LOW level of the node C1 at the end of the recall operation.

Turning back to FIG. 16, the fourth operation is a read operation that reads the data of the SRAM cells 131 through 133 for output from the nonvolatile semiconductor memory device 20C. The write enable signal WEB, the store enable signal STB, and the recall enable signal RCB are kept at HIGH, and the output enable signal OEB and the chip enable signal CEB are set to LOW to specify a read operation.

Figure 19:
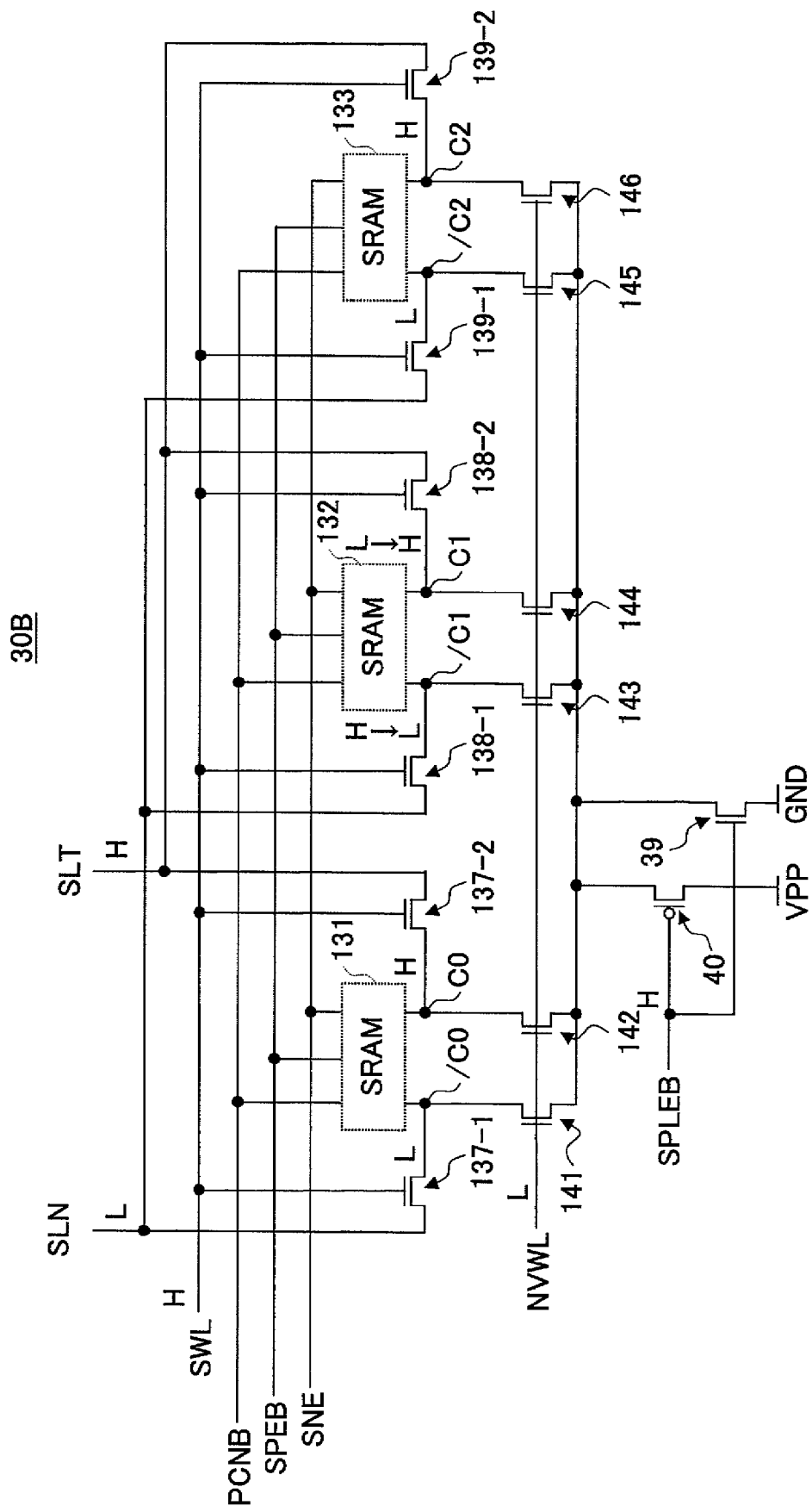
FIG. 19 is a drawing for explaining the data read operation of the memory cell unit shown in FIG. 14.

FIG. 19 is a drawing for explaining the data read operation of the memory cell unit 30B shown in FIG. 14. In FIG. 19, the same elements as those of FIG. 14 are referred to by the same numerals, and a description thereof will be omitted.

As shown in FIG. 19, the SRAM word line SWL is set to HIGH to electrically connect the SPAM cells 131 through 133 to the SARM data lines SLN and SLT. The SRAM cell 131 urges SLN and SLT to be LOW and HIGH, respectively, and so does the SPAM cell 133. The SRAM cell 132, however, urges SLN and SLT to be HIGH and LOW, respectively. Since the combined force of the SRAM cells 131 and 133 is stronger than the force exerted by the SRAM cell 132, the SRAM cells 131 and 133 win. That is, the majority controls the SARM data lines SLN and SLT.

FIG. 20 is a truth table showing the relationships between the signal levels of the nodes C0 through C2 and the signal level of the SARM data line SLT. As shown in FIG. 20, the signal level of the SARM data line SLT is HIGH when the majority (i.e., no fewer than two in this case) of the three nodes are HIGH.

Turning back to FIG. 16, as a result of the read operation, the data DOUT output from the Dout buffer 22 to outside the nonvolatile semiconductor memory device 20C is set to "00h", which is equal to the input data DIN entered at the SRAM write operation. Please note that the sense-amplifier-&-write-amplifier unit 24 performs data inversion in the same manner as does the inverter 93 shown in FIG. 6, thereby ensuring a correct data output despite the reversal of bit values of the SRAM cells 131 and 133 between the store operation shown in FIG. 17 and the recall operation shown in FIG. 18.

The embodiments described above have been directed to an example in which the number of bits for use in majority decision making was three. This is not a limiting example, and the number of bits for use in majority decision making may alternatively be any odd number more than three.

Further, the present invention is not limited to these embodiments, but various variations and modifications may be made without departing from the scope of the present invention.

What is claimed is:

1. A nonvolatile semiconductor memory device, comprising:
 a nonvolatile memory cell including an odd number of MIS transistor pairs, each of which stores one-bit data by creating an irreversible change of transistor characteristics in one of the two paired MIS transistors;
 latches equal in number to the odd number of MIS transistor pairs to store the odd number of one-bit data recalled from the MIS transistor pairs, the recalling of the one-bit data of a given MIS transistor pair being performed by sensing a difference in the transistor characteristics between the two paired MIS transistors of the given MIS transistor pair; and
 a majority decision circuit configured to make a majority decision based on the odd number of one-bit data to determine a bit value of the nonvolatile memory cell.

2. The nonvolatile semiconductor memory device as claimed in claim 1, comprising a plurality of memory cell units arranged in rows and columns, each of the memory cell units having an identical circuit configuration including:
 the nonvolatile memory cell; and
 a sense latch coupled to the nonvolatile memory cell to sense a difference in the transistor characteristics between the two paired MIS transistors of a selected one of the MIS transistor pairs,
 wherein the latches are configured to store the odd number of one-bit data successively recalled by the sense latch from the MIS transistor pairs of a selected one of the memory cell units, and the majority decision circuit is configured to make a majority decision based on the odd number of one-bit data to determine a bit value of the selected one of the memory cell units.

3. The nonvolatile semiconductor memory device as claimed in claim 1, comprising a plurality of memory cell units arranged in rows and columns, each of the memory cell units having an identical circuit configuration including:
 the nonvolatile memory cell;
 the latches; and
 the majority decision circuit,
 wherein the majority decision circuit of a given memory cell unit is configured to make a majority decision based on the odd number of one-bit data to determine a bit value of the given memory cell unit.

4. The nonvolatile semiconductor memory device as claimed in claim 3, wherein each of the memory cell units further includes a sense latch coupled to the nonvolatile memory cell to sense a difference in the transistor characteristics between the two paired MIS transistors of a selected one of the MIS transistor pairs, and the latches are configured to store the odd number of one-bit data successively recalled by the sense latch from the MIS transistor pairs.

5. The nonvolatile semiconductor memory device as claimed in claim 3, wherein each of the memory cell units further includes an inverter to invert a logical value of the one-bit data recalled from the MIS transistor pairs.

6. The nonvolatile semiconductor memory device as claimed in claim 1, comprising a plurality of memory cell units arranged in rows and columns, each of the memory cell units having an identical circuit configuration including:
 the nonvolatile memory cell; and
 the latches, which are coupled in one-to-one correspondence to the MIS transistor pairs of the nonvolatile memory cell, and are configured to sense a difference in the transistor characteristics between the two paired MIS transistors of the respective MIS transistor pairs.

7. The nonvolatile semiconductor memory device as claimed in claim 6, wherein each of the memory cell units includes the majority decision circuit.

8. The nonvolatile semiconductor memory device as claimed in claim 7, wherein the majority decision circuit includes transistors disposed between the latches and a common node, the latches being electrically connected to the common node in response to an ON state of the transistors.

* * * * *